(12) United States Patent
Lee et al.

(10) Patent No.: US 9,472,569 B2
(45) Date of Patent: Oct. 18, 2016

(54) METHOD OF MANUFACTURING A DOUBLE-SOURCE SEMICONDUCTOR DEVICE

(71) Applicant: SK hynix Inc., Icheon-si Gyeonggi-do (KR)

(72) Inventors: Ki Hong Lee, Suwon-si (KR); Seung Ho Pyi, Seongnam-si (KR); Ji Yeon Baek, Suwon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/944,865

(22) Filed: Nov. 18, 2015

(65) Prior Publication Data
US 2016/0079272 A1   Mar. 17, 2016

Related U.S. Application Data

(63) Continuation of application No. 14/593,061, filed on Jan. 9, 2015, now Pat. No. 9,224,752.

(30) Foreign Application Priority Data

Aug. 13, 2014 (KR) ........................ 10-2014-0105287

(51) Int. Cl.

| | |
|---|---|
| H01L 21/00 | (2006.01) |
| H01L 27/00 | (2006.01) |
| H01L 29/00 | (2006.01) |
| H01L 27/115 | (2006.01) |
| H01L 21/223 | (2006.01) |
| H01L 21/285 | (2006.01) |
| H01L 21/762 | (2006.01) |
| H01L 21/768 | (2006.01) |
| H01L 29/06 | (2006.01) |
| H01L 29/45 | (2006.01) |
| H01L 29/66 | (2006.01) |

(52) U.S. Cl.
CPC ....... *H01L 27/11582* (2013.01); *H01L 21/223* (2013.01); *H01L 21/28518* (2013.01); *H01L 21/762* (2013.01); *H01L 21/76871* (2013.01); *H01L 27/1157* (2013.01); *H01L 27/11565* (2013.01); *H01L 27/11573* (2013.01); *H01L 29/0649* (2013.01); *H01L 29/456* (2013.01); *H01L 29/66833* (2013.01)

(58) Field of Classification Search
CPC .......... H01L 21/76871; H01L 21/762; H01L 21/223; H01L 21/28518; H01L 27/11582; H01L 27/11573; H01L 27/11565; H01L 27/1157; H01L 29/456; H01L 29/0649; H01L 29/66833
See application file for complete search history.

(56) References Cited

U.S. PATENT DOCUMENTS

2009/0236660 A1* 9/2009 Takahashi ........... H01L 29/1095
  257/334
2011/0291176 A1* 12/2011 Lee .................... H01L 27/11578
  257/324
2012/0061743 A1* 3/2012 Watanabe ......... H01L 27/11578
  257/324

(Continued)

*Primary Examiner* — Nikolay Yushin
(74) *Attorney, Agent, or Firm* — William Park & Associates Ltd.

(57) ABSTRACT

A semiconductor device may include a first source layer, a first insulating layer located over the first source layer, and a first stacked structure located over the first insulating layer. The semiconductor device may include first channel layers passing through the first stacked structure and the first insulating layer. The semiconductor device may include a second source layer including a first region interposed between the first source layer and the first insulating layer and a second region interposed between the first channel layers and the first insulating layer.

13 Claims, 33 Drawing Sheets

(56) References Cited

U.S. PATENT DOCUMENTS

| | | | |
|---|---|---|---|
| 2012/0068255 A1* | 3/2012 | Lee | H01L 27/11582 257/324 |
| 2013/0009229 A1* | 1/2013 | Lee | H01L 29/66833 257/314 |
| 2013/0017629 A1* | 1/2013 | Pyo | H01L 22/26 438/16 |
| 2013/0049090 A1* | 2/2013 | Lindsay | H01L 21/26586 257/306 |
| 2013/0146958 A1* | 6/2013 | Kim | H01L 27/10885 257/302 |
| 2013/0161710 A1* | 6/2013 | Ji | H01L 29/66666 257/296 |
| 2013/0193503 A1* | 8/2013 | Lee | H01L 27/11582 257/314 |

* cited by examiner

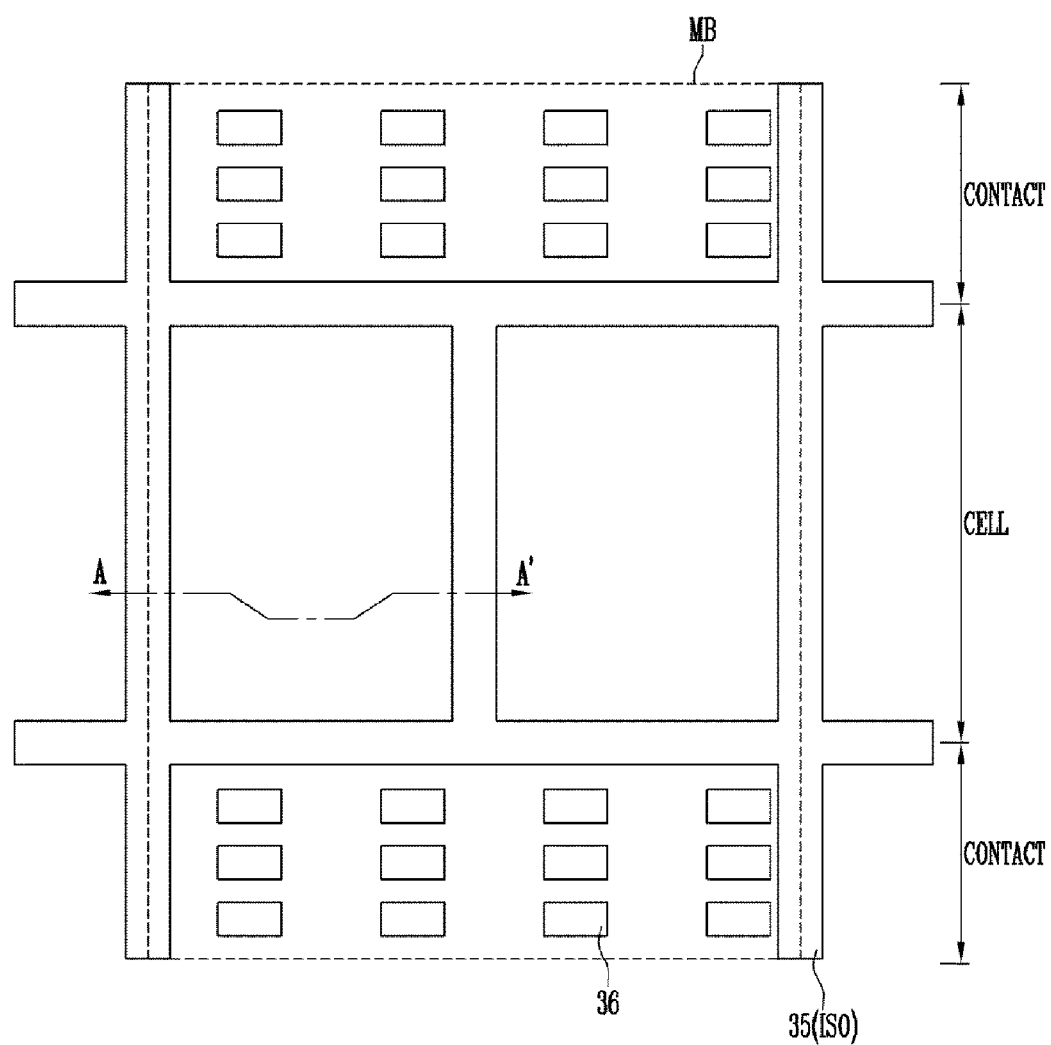

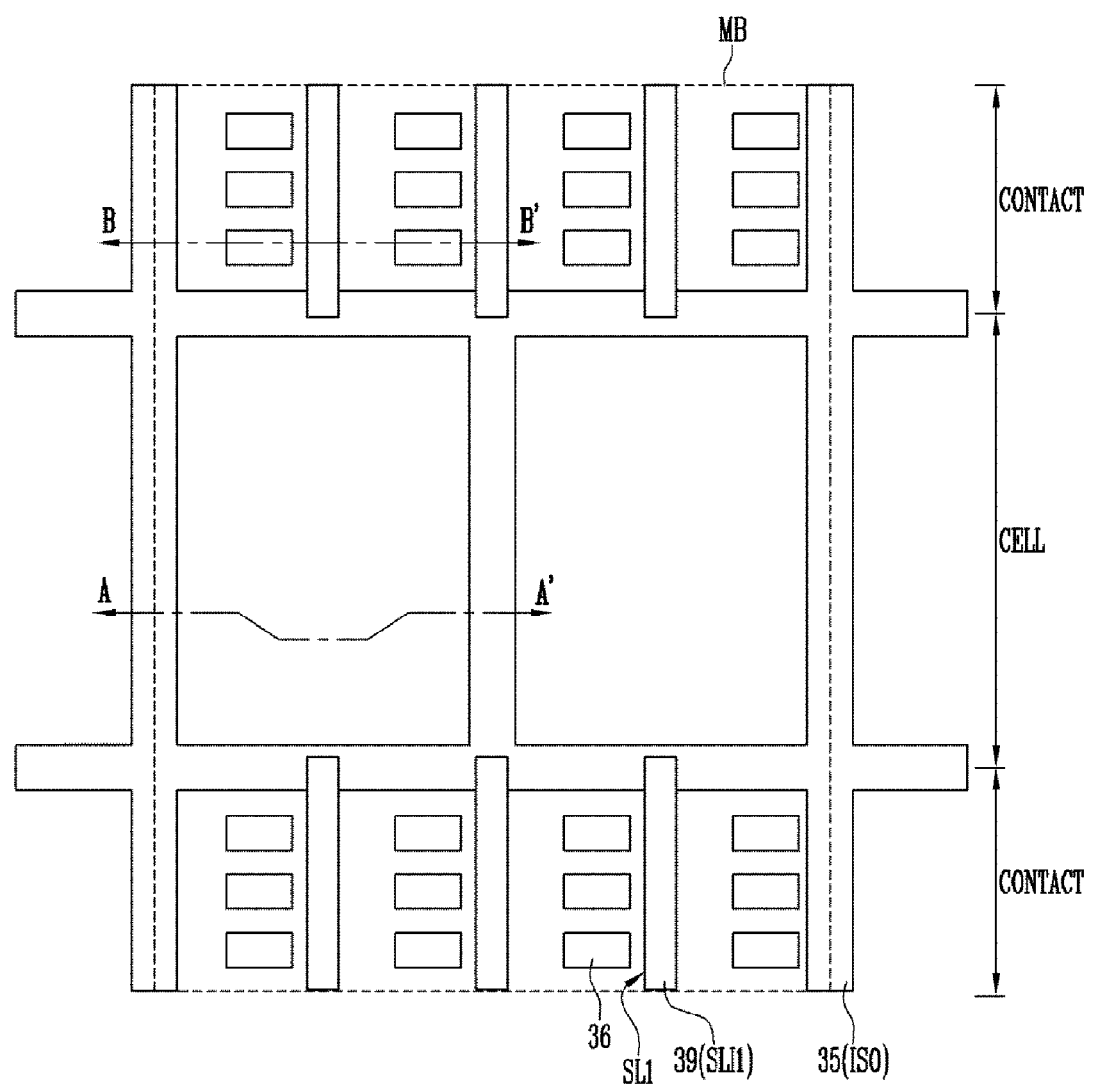

A-A'

B-B'

METHOD OF MANUFACTURING A DOUBLE-SOURCE SEMICONDUCTOR DEVICE

CROSS-REFERENCE TO RELATED APPLICATION

The application is a Continuation of U.S. application Ser. No. 14/593,061, filed on Jan. 9, 2015, and the present application claims priority to Korean patent application number 10-2014-0105287 filed on Aug. 13, 2014, in the Korean Intellectual Property Office, the entire disclosure of which is incorporated by reference herein.

BACKGROUND

1. Technical Field

Various embodiments relate generally to an electronic device and a method of manufacturing the same and a method of operating the same and, more particularly, to a semiconductor device including a three-dimensional structure and a method of manufacturing the same.

2. Related Art

Non-volatile memory devices retain stored data in the absence of a power supply. Two-dimensional memory devices, in which memory cells are fabricated in a single layer over a silicon substrate, have reached limits in increasing the degree of integration within these two-dimensional memory devices. Accordingly, three-dimensional non-volatile memory devices having memory cells stacked in a vertical direction over a silicon substrate, have been proposed.

A conventional three-dimensional non-volatile memory device has a structure having interlayer insulating layers and gate electrodes stacked alternately with each other, and channel layers penetrating therethrough. Memory cells may be stacked along the channel layers. In addition, a string may be arranged in a U shape in order to improve a degree of integration of the memory device.

However, as a height of the stacked structure increases, it may be more difficult to perform an etch process thereon. In addition, when the string is arranged in the U shape, cell current may be reduced due to an increased length of a channel. In addition, operating characteristics may deteriorate because a sufficient amount of current may not flow during a program or erase operation.

BRIEF SUMMARY

A semiconductor device according to an embodiment may include a first source layer, a first insulating layer located over the first source layer, and a first stacked structure located over the first insulating layer. The semiconductor device may include first channel layers passing through the first stacked structure and the first insulating layer. The semiconductor device may include a second source layer including a first region interposed between the first source layer and the first insulating layer and a second region interposed between the first channel layers and the first insulating layer.

A semiconductor device according to an embodiment may include a first source layer, a first insulating layer formed over the first source layer, and a first stacked structure formed over the first insulating layer. The semiconductor device may include first channel layers passing through the first stacked structure, and gap-filling insulating layers formed in the first channel layers and passing through the first insulating layer. The semiconductor device may include a second source layer including a first region interposed between the gap-filling insulating layers and the first insulating layer.

BRIEF DESCRIPTION OF THE DRAWINGS

FIGS. 10A to 14A, FIGS. 10B to 14B, and FIGS. 10C to 13C are enlarged views illustrating a representation of a method of manufacturing a semiconductor device according to an embodiment of the present invention.

DETAILED DESCRIPTION

Figure 1A:
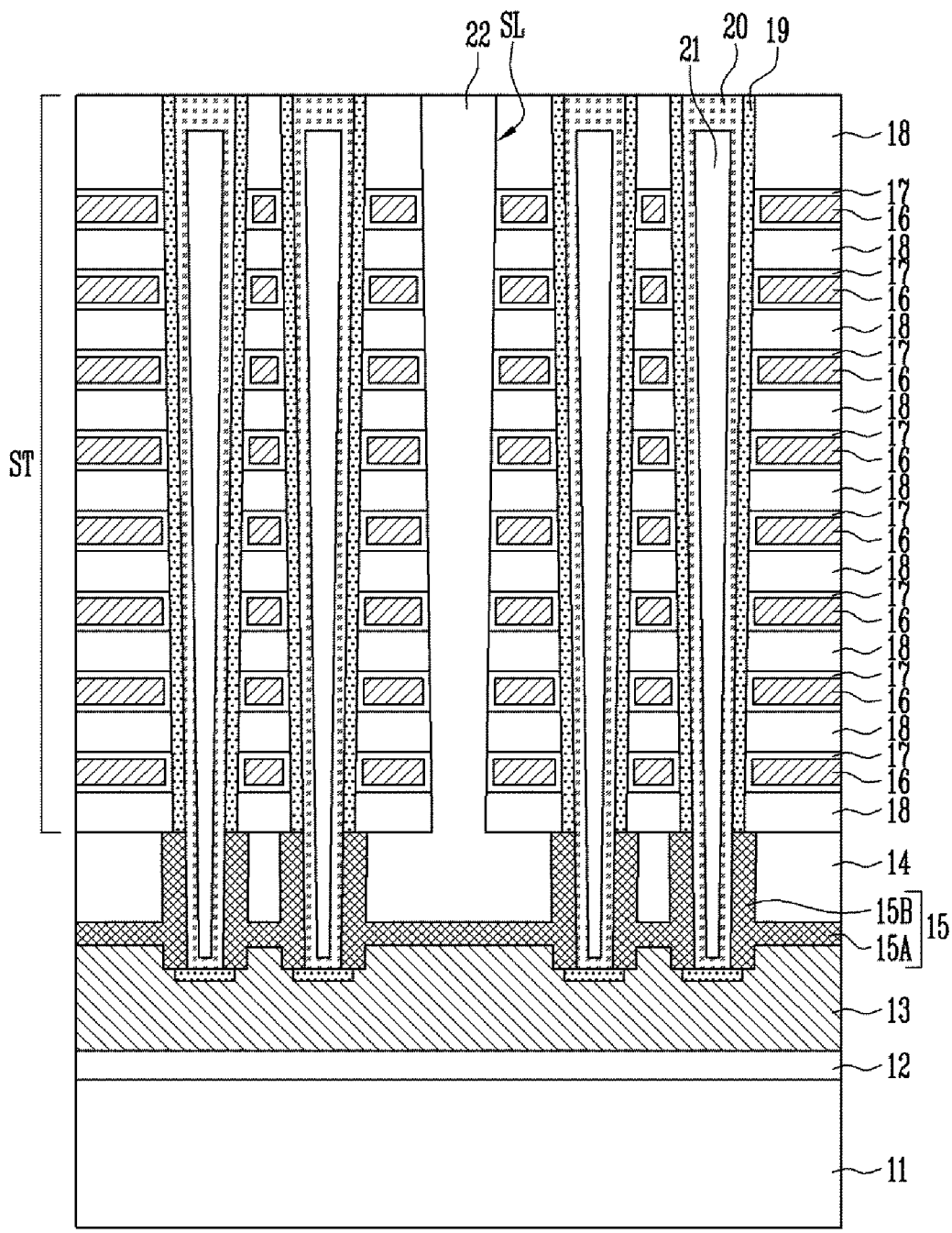
FIGS. 1A to 1D are cross-sectional views illustrating a representation of the structure of a semiconductor device according to an embodiment.

Hereinafter, various examples of embodiments will be described in detail with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring subject manner. Like reference numerals refer to like elements throughout the specification and drawings.

Various embodiments may generally relate to a method of manufacturing a semiconductor memory device which may make it easier to manufacture and may provide improved characteristics.

FIGS. 1A to 1D are cross-sectional diagrams illustrating a representation of the structure of a semiconductor device according to an embodiment.

Figure 1B:
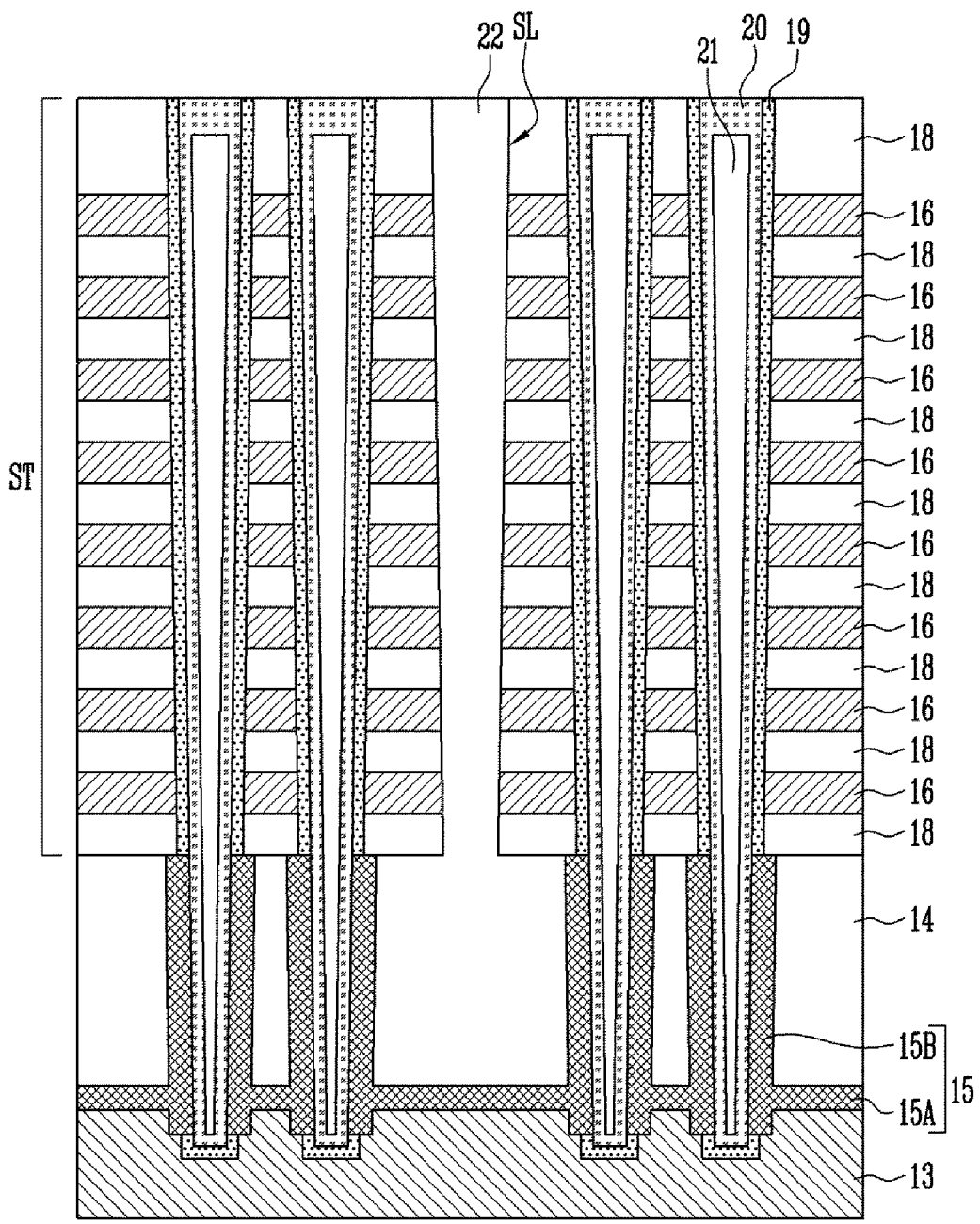

Referring to FIGS. 1A and 1B, a semiconductor device according to an embodiment may include a first source layer 13, a first insulating layer 14, and a second source layer 15. The semiconductor device may include memory layers 19 and channel layers 20.

The first source layer 13 may be a separate layer configured as a source, or a region formed by doping the substrate 11 with impurities. FIG. 1A illustrates forming the first source layer 13 by using a conductive layer including doped polysilicon. Referring to FIG. 1A, the semiconductor device may further include a substrate 11 located under the first source layer 13 and a second insulating layer 12. The second insulating layer 12 may insulate the substrate 11 from the first source layer 13. FIG. 1B illustrates forming the first source layer 13 by doping the substrate 11 with impurities by a predetermined depth. Referring to FIG. 1B, the second source layer 15 may directly contact the substrate 11 that has been doped with impurities to create the first source layer 13.

The first insulating layer 14 may be formed over the first source layer 13 and include an insulating material such as oxide. Since a distance between a lower selection transistor and the first source layer 13 is determined by a height of the first insulating layer 14, the height of the first insulating layer 14 may be controlled in consideration of the distance therebetween.

The second source layer 15 may include a first region 15A and a second region 15B. The first region 15A may be interposed between the first source layer 13 and the first insulating layer 14. The second region 15B may be interposed between the channel layer 20 and the first insulating layer 14. The first region 15A may directly make contact with the first source layer 13. The second region 15B may directly make contact with the channel layer 20. The second source layer 15 may be a silicon layer grown by selective growth.

A stacked structure ST including conductive layers 16 and third insulating layers 18 stacked alternately with each other may be arranged over the first insulating layer 14. Each of the conductive layers 16 may be a gate electrode of a memory cell or a selection transistor. For example, at least one lowermost conductive layer 16 may be a lower selection gate of a lower selection transistor, at least one uppermost conductive layer 16 may be an upper selection gate of an upper selection transistor, and the remaining conductive layers 16 may be gate electrodes of memory cells. The conductive layers 16 may include, for example but not limited to, silicon, tungsten, tungsten nitride, titanium, titanium nitride, tantalum, tantalum nitride, or the like. In addition, the third insulating layers 18 may include insulating materials for insulating the stacked gate electrodes. For example, the third insulating layers 18 may include, for example but not limited to, an oxide, a nitride, or the like.

The channel layers 20 may pass through the stacked structure ST and the first insulating layer 14 and directly make contact with the second source layer 15. The channel layers 20 may share the second source layer 15. In addition, the channel layer 20 may include a central portion that may be completely filled, an open central portion, or a combination thereof. The open central portion may be filled with a gap-filling insulating layer 21.

The memory layer 19 may be interposed between the channel layer 20 and the stacked structure ST. For example, the memory layer 19 may include at least one of, for example, a tunnel insulating layer, a data storage layer and a charge blocking layer. The data storage layer may include, for example but not limited to, silicon, nitride, nanodots, phase-change materials, or the like. In addition, charge blocking layers 17 having substantially a C shape may be further formed. The charge blocking layers 17 may surround the conductive layers 16, respectively.

A slit SL passing through the stacked structure ST and the first insulating layer 14 may be located between the channel layers 20. The slit SL may be filled with the slit insulating layer 22. The first insulating layer 14 and the slit insulating layer 22 may be connected in a single body. In addition, the slit insulating layer 22 may include, for example but not limited to, an oxide.

Figure 1C:
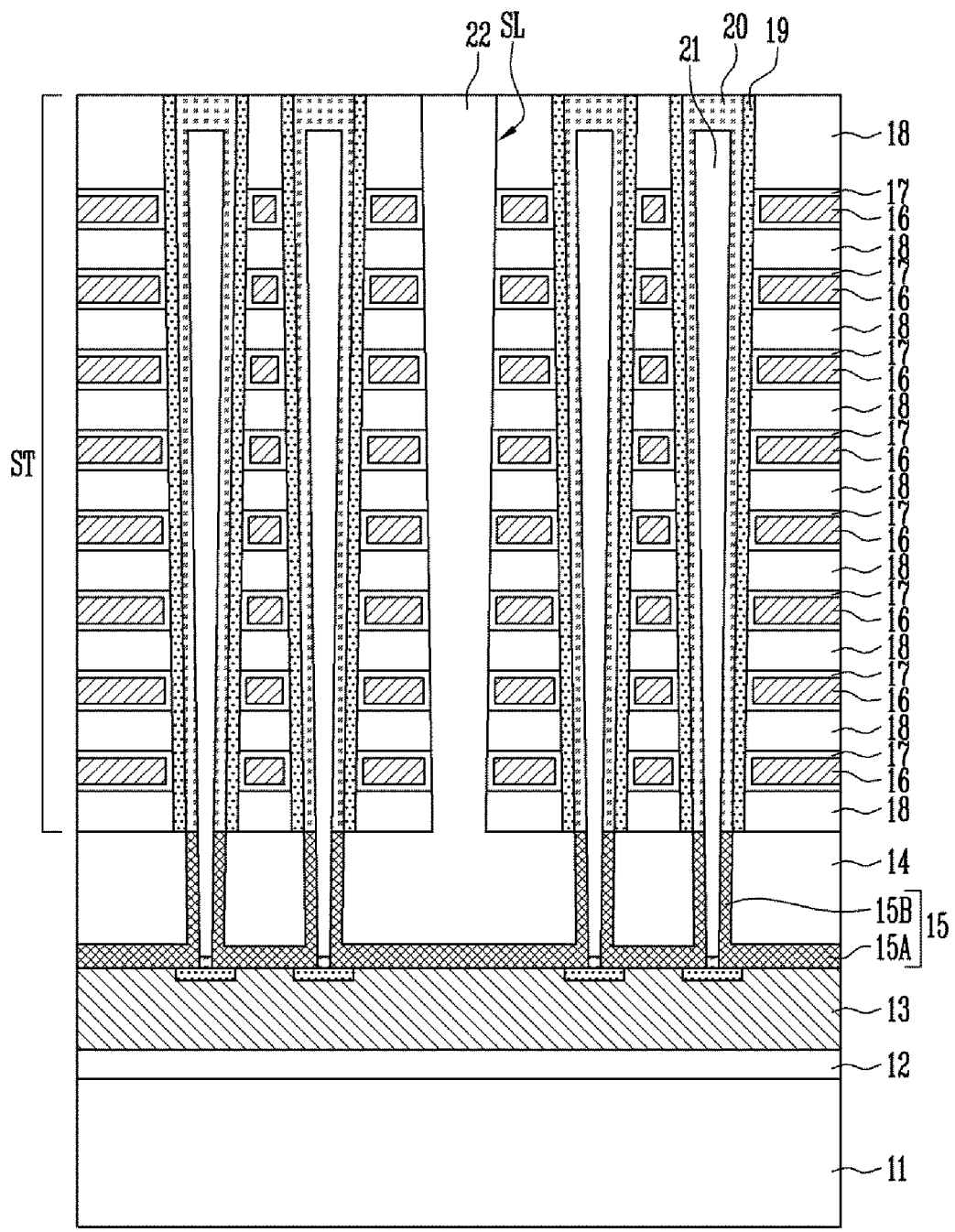

Referring to FIG. 1C, the channel layers 20 may pass through the stacked structure ST, and the gap-filling insulating layers 21 formed in the channel layers 20 may pass through the first insulating layer 14. In other words, the gap-filling insulating layers 21 may extend down further than the channel layers 20. In addition, the second source layer 15 may include a first region 15A and a second region 15B. The first region 15A may be interposed between the first source layer 13 and the first insulating layer 14. The second region 15B may be interposed between the gap-filling insulating layers 21 and the first insulating layer 14. The second source layer 15 may include, for example but not limited to, a silicide layer. For example, the second source layer 15 may be a silicide layer formed by siliciding lower portions of the channel layers 20 and a surface of the first source layer 13.

Figure 1D:
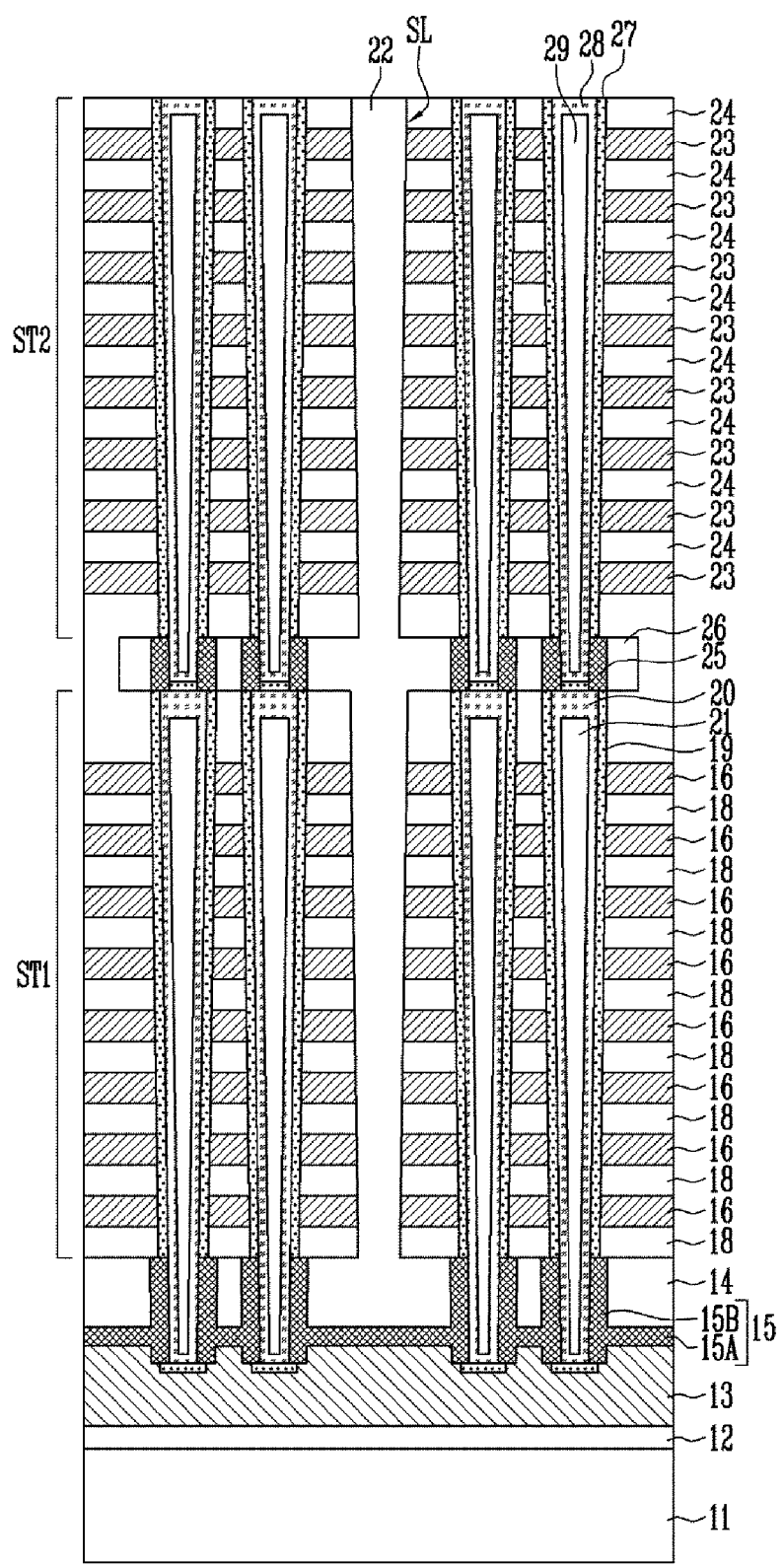

Referring to FIG. 1D, the first stacked structure ST1 and a lower structure thereof may be configured as described above with reference to FIG. 1A or 1B. In addition, a second stacked structure ST2 may be formed over the first stacked structure ST1.

The second stacked structure ST2 may include conductive layers 23 and fourth insulating layers 24 stacked alternately with each other. The second channel layers 28 may pass through the second stacked structure ST2 and be connected or coupled to the first channel layers 20, respectively. Second memory layers 27 may be interposed between the second channel layers 28 and the second stacked structure ST2. Coupling patterns 25 may be formed on lower sidewalls of the second channel layers 28 which are not surrounded by the second memory layers 27, respectively. The coupling patterns 25 may directly make contact with the upper portions of the first channel layers 20 and the lower portions of the second channel layers 28 and connect the first and second channel layers 20 and 28 to each other. In addition, an insulating layer 26 may be formed to surround the coupling patterns 25.

The slit SL may pass through the first and second stacked structures ST1 and ST2. In addition, the first insulating layer 14, the slit insulating layer 22 and the insulating layer 26 may be connected in a single body.

In the semiconductor device having the above-described structure, at least one lower selection transistor, a plurality of memory cells and at least one upper selection transistor may be coupled in series with each other to form a single string. The string may be arranged in substantially a vertical direction. In addition, a plurality of strings may share the first and second source layers 13 and 15.

FIGS. 2A to 6B are cross-sectional diagrams illustrating a representation of a method of manufacturing a semiconductor device according to an embodiment.

Figure 2B:
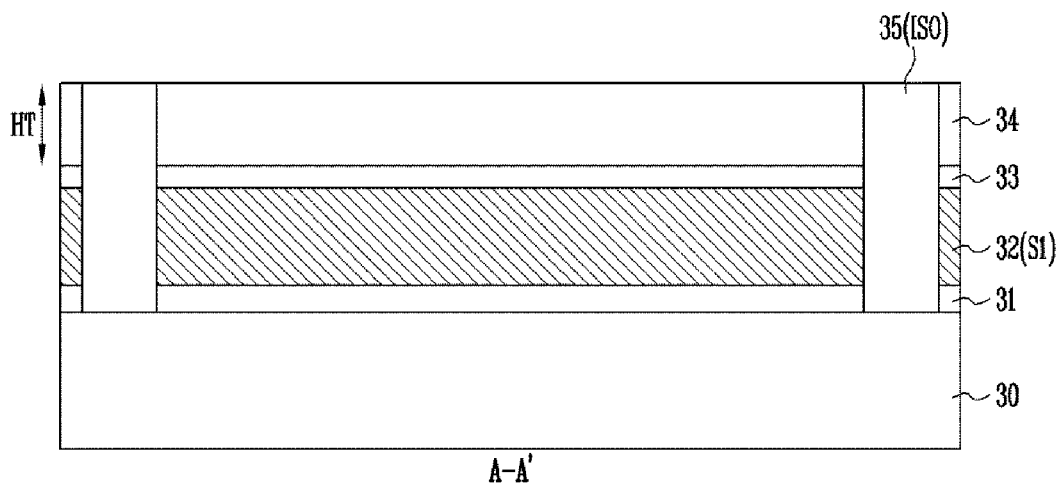
FIGS. 2A to 6B are cross-sectional views illustrating a representation of a method of manufacturing a semiconductor device according to an embodiment.

Referring to FIGS. 2A and 2B, a first insulating layer 31, a first conductive layer 32, a first sacrificial layer 33 and a second sacrificial layer 34 may be sequentially formed over a substrate 30. The first conductive layer 32 may be a first source layer (S1). For example, the first conductive layer 32 may include doped polysilicon, the first sacrificial layer 33 may include an oxide, and the second sacrificial layer 34 may include undoped polysilicon. A distance between a lower selection transistor and the first conductive layer 32 may be determined by a height of the second sacrificial layer 34. Thus, a height HT of the second sacrificial layer 34 may be determined in consideration of the distance therebetween.

Subsequently, second insulating layers 35 may pass through the second sacrificial layer 34, the first sacrificial layer 33 and the first conductive layer 32. The second insulating layers 35 may be isolation layers (ISO) located at the boundary between neighboring memory blocks MB and at the boundary between the cell region CELL and the contact region CONTACT. The second sacrificial layer 34, the first sacrificial layer 33 and the first conductive layer 32 may be patterned into regions by these isolation layers.

Figure 2C:
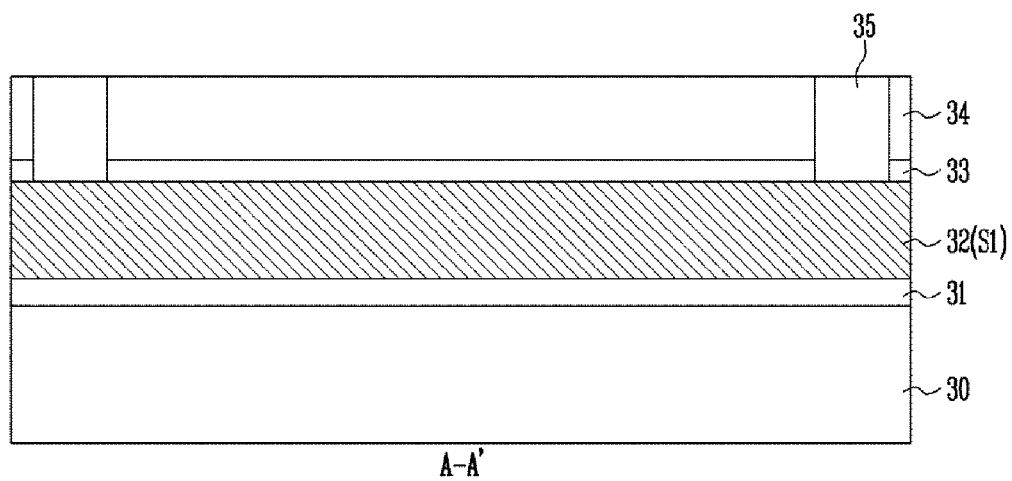

FIG. 2C is a modified example of FIG. 2B. Referring to 2C, the second insulating layers 35 may have a relatively small depth to pass through the second sacrificial layer 34 and the first sacrificial layer 33, so that the second sacrificial layer 34 may be patterned into regions.

In addition, third insulating layers 36 may be further formed to be located in the contact region CONTACT. The third insulating layers 36 may be formed at the same time or substantially the same time as the second insulating layers 35 are formed. The third insulating layers 36 may have substantially the same depth as the second insulating layers 35.

Figure 3B:
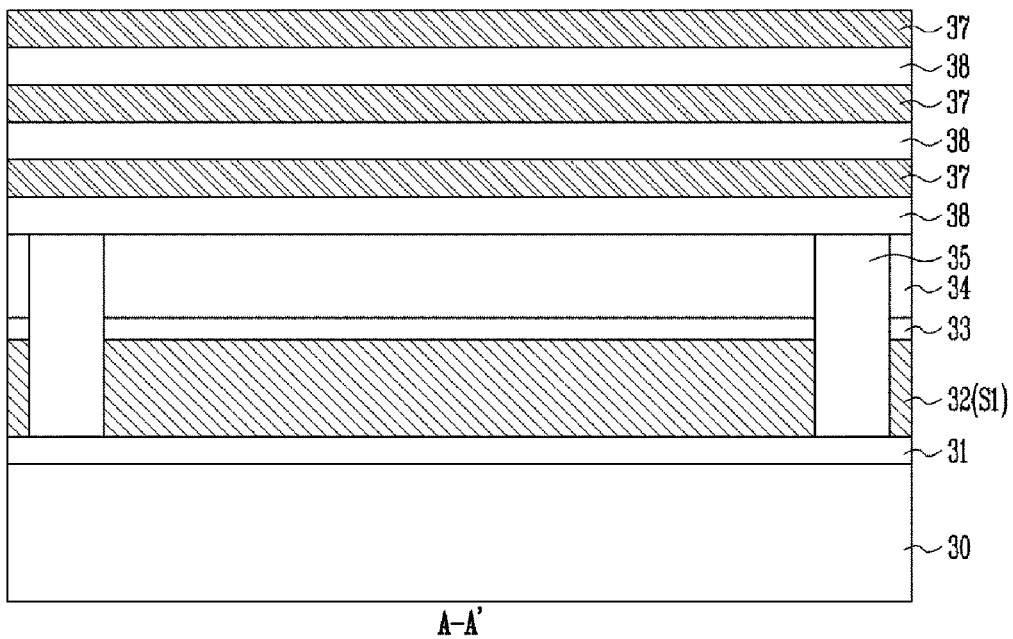
Figure 3C:
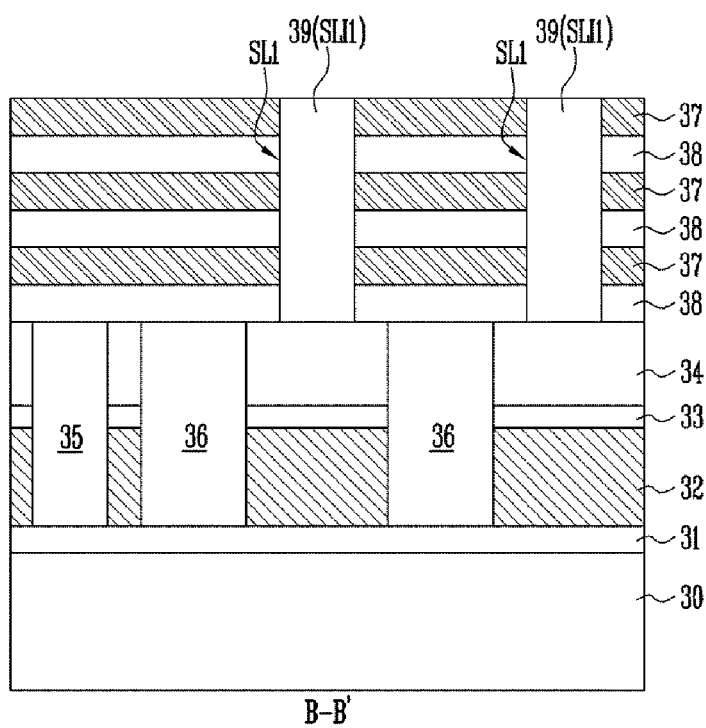

Referring to FIGS. 3A to 3C, a lower stacked structure may be formed over the second sacrificial layer 34. The lower stacked structure may include one or more first material layers 37 and one or more second material layers 38 stacked alternately with each other. The first material layers 37 may be configured to form gate electrodes of lower selection transistors, and the second material layers 38 may be formed to insulate the stacked gate electrodes.

The first material layers 37 may include a material having a high etch selectivity with respect to the second material layers 38. For example, the first material layers 37 may include a sacrificial layer including a nitride, and the second material layers 38 may include an insulating layer including an oxide. In other examples, the first material layers 37 may include a conductive layer including, for example but not limited to, doped polysilicon, doped amorphous silicon, or the like. The second material layers 38 may include an insulating layer, such as an oxide. According to an embodiment, a description is made in reference to an example in which the first material layers 37 include a sacrificial layer and the second material layers 38 include an insulating layer.

Subsequently, first slits SL1 may be formed through the lower stacked structure, fourth insulating layers 39 (SLI1) may be formed in the first slits SL1. The fourth insulating layer 39 may be a first slit insulating layer for patterning the lower stacked structure. In addition, the fourth insulating layers 39 may be located between the third insulating layers 36 in the contact region CONTACT and have a line shape extending in one direction.

Figure 4A:
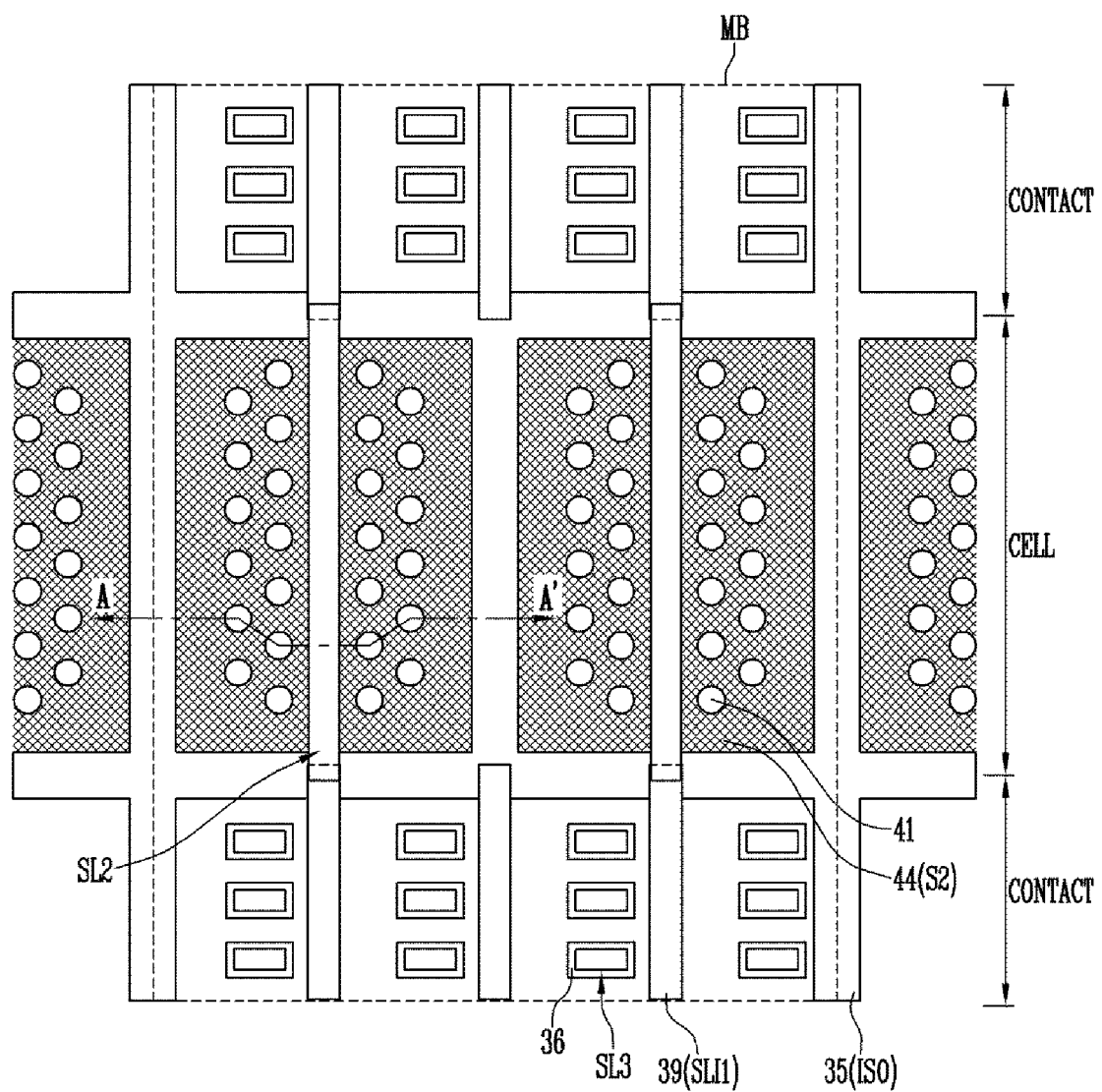

Referring to FIG. 4A, the stacked structure ST may be formed by forming an upper stacked structure over the lower stacked structure. Semiconductor layers 41 may be formed through the stacked structure ST, and second slits SL2 may be formed between the semiconductor layers 41 in the cell region CELL. The second slits SL2 may have a line shape extending in one direction so as to be coupled to the fourth insulating layers 39. In other words, the fourth insulating layer 39 may be exposed on both ends of the second slit SL2. In addition, when the second slit SL2 is formed, third slits SL3 may be formed over the third insulating layer 36 in the contact region CONTACT. The third slit SL3 may be deep enough to pass through the stacked structure ST and expose the third insulating layer 36. Subsequently, a second conductive layer 44 (S2) may be formed so that the second conductive layer 44 may contact lower portions of the semiconductor layers 41. Hereinafter, a method of manufacturing the structure shown in FIG. 4A is described with reference to FIGS. 4B to 4E.

Figure 4B:
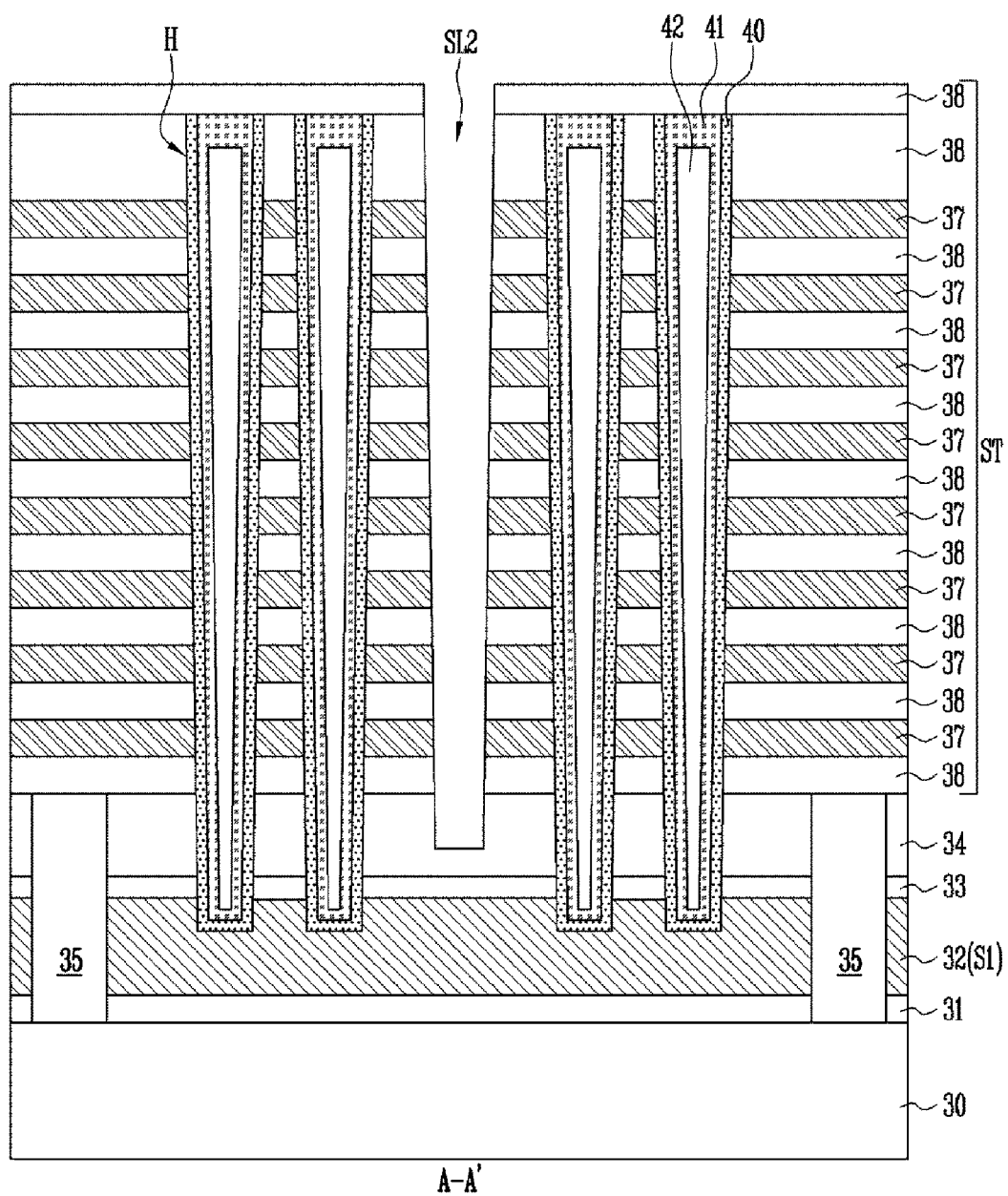

First, referring to FIG. 4B, the stacked structure ST may be formed by forming the upper stacked structure over the lower stacked structure. The upper stacked structure may include the first material layers 37 and the second material layers 38 stacked alternately with each other. At least one uppermost first material layer 37 may be configured to form a gate electrode of an upper selection transistor, and the remaining first material layers 37 may be configured to form gate electrodes of memory cells. In addition, the second material layers 38 may be formed to insulate the stacked gate electrodes. The uppermost second material layer 38 may have a greater thickness than the remaining second material layers 38.

Subsequently, holes H may be formed through the stacked structure ST and the second sacrificial layer 34. The holes H may be deep enough to pass through the first sacrificial layer 33 and extend to the first conductive layer 32 (S1). In addition, the holes H may have various cross-sections such as, for example but not limited to, circular, rectangular, polygonal and oval shapes.

Subsequently, multilayer dielectric layers 40 may be formed in the holes H. Each of the multilayer dielectric layers 40 may be a memory layer of a memory cell or a gate insulating layer of a selection transistor. For example, the multilayer dielectric layer 40 may include a tunnel insulating layer, a data storage layer and a charge blocking layer. The data storage layer may include, for example but not limited to, silicon, nitride, nanodots, phase-change materials, or the like.

The semiconductor layers 41 may be formed in the holes H in which the multilayer dielectric layers 40 are formed. Gap-filling insulating layers 42 may be formed in open central regions of the semiconductor layers 41. The semiconductor layers 41 may be arranged in a matrix format at a predetermined distance, or in a zigzag pattern. Subsequently, another second material layer 38 may be further formed over the stacked structure ST to cover the multilayer dielectric layers 40 and the semiconductor layers 41 exposed on a top surface of the stacked structure ST.

The second slit SL2 may be further formed through the stacked structure ST. The second slit SL2 may be deep enough to pass through the stacked structure ST and expose the second sacrificial layer 34.

Figure 4C:
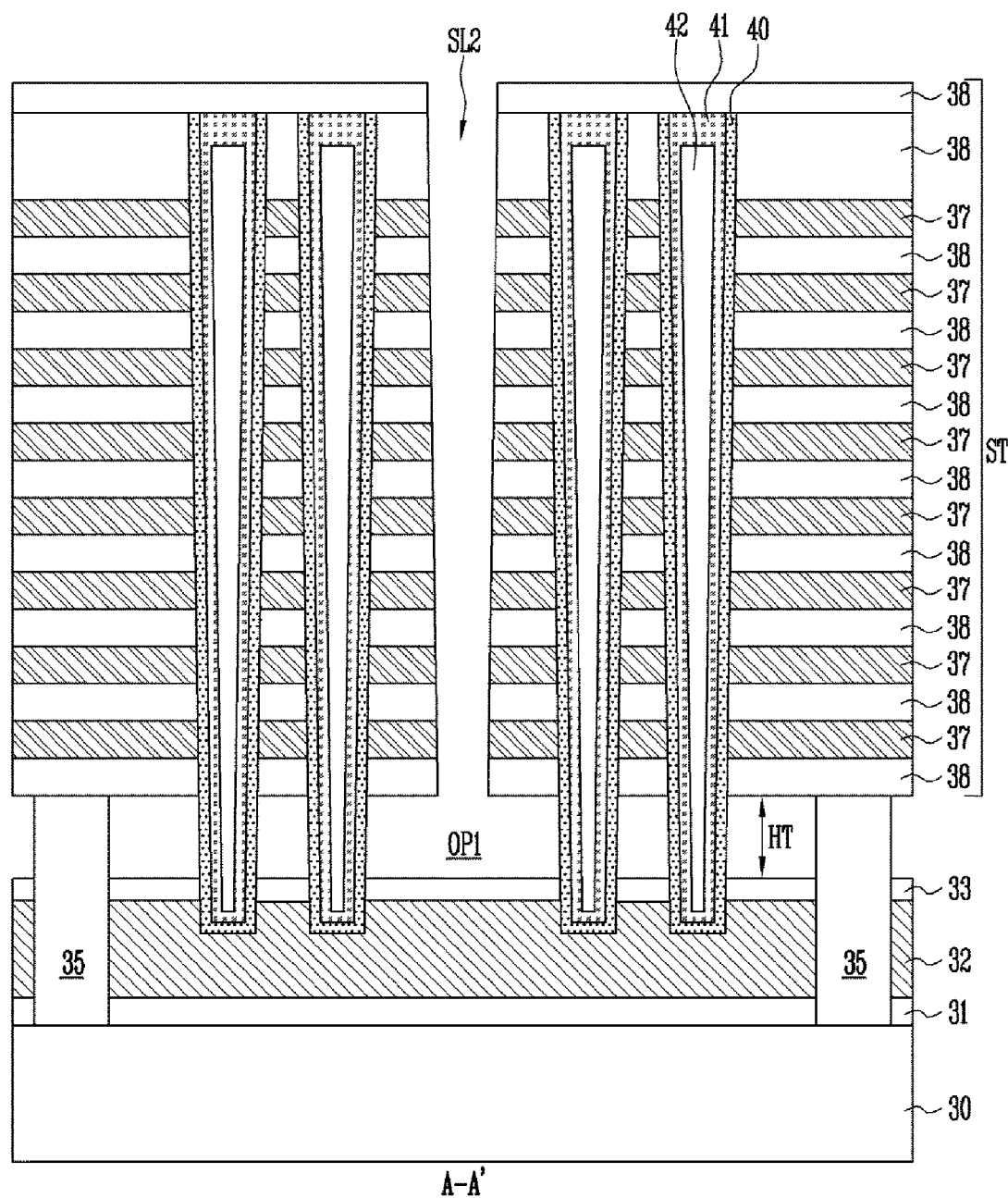

Referring to FIG. 4C, the second sacrificial layer 34 may be removed through the second slit SL2 to form the first opening OP1. As a result, the multilayer dielectric layer 40 may be exposed through the first opening OP1.

Figure 4D:
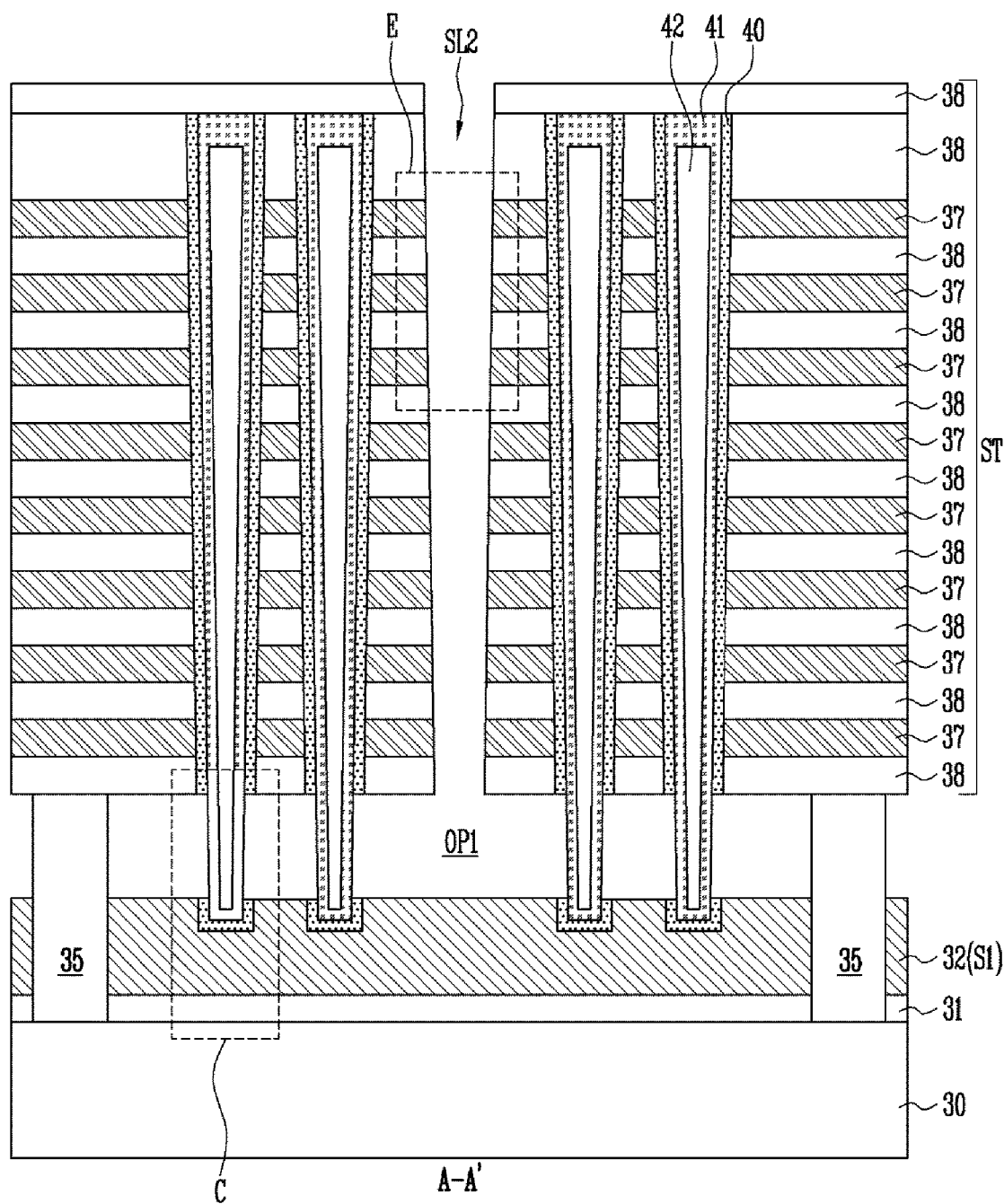

Referring to FIG. 4D, the multilayer dielectric layers 40 exposed through the first opening OP1 may be removed to expose the semiconductor layers 41. However, only portions of the multilayer dielectric layers 40 which are exposed through the first opening OP1 may be removed. Therefore, a height to which the multilayer dielectric layers 40 are removed may be controlled by the height HT (see FIG. 4C) of the first opening OP1. In other words, the height to which the multilayer dielectric layers 40 are removed may be controlled by the height of the second sacrificial layer 34 (see FIG. 4B). In addition, when the portions of the multilayer dielectric layers 40 are removed, the first sacrificial layer 33 may also be removed (see FIG. 4C). The process in which the multilayer dielectric layer 40 and the first sacrificial layer 33 are removed will be described below with reference to FIGS. 10A to 14A, FIGS. 10B to 14B, and FIGS. 10C to 13C.

Figure 4E:
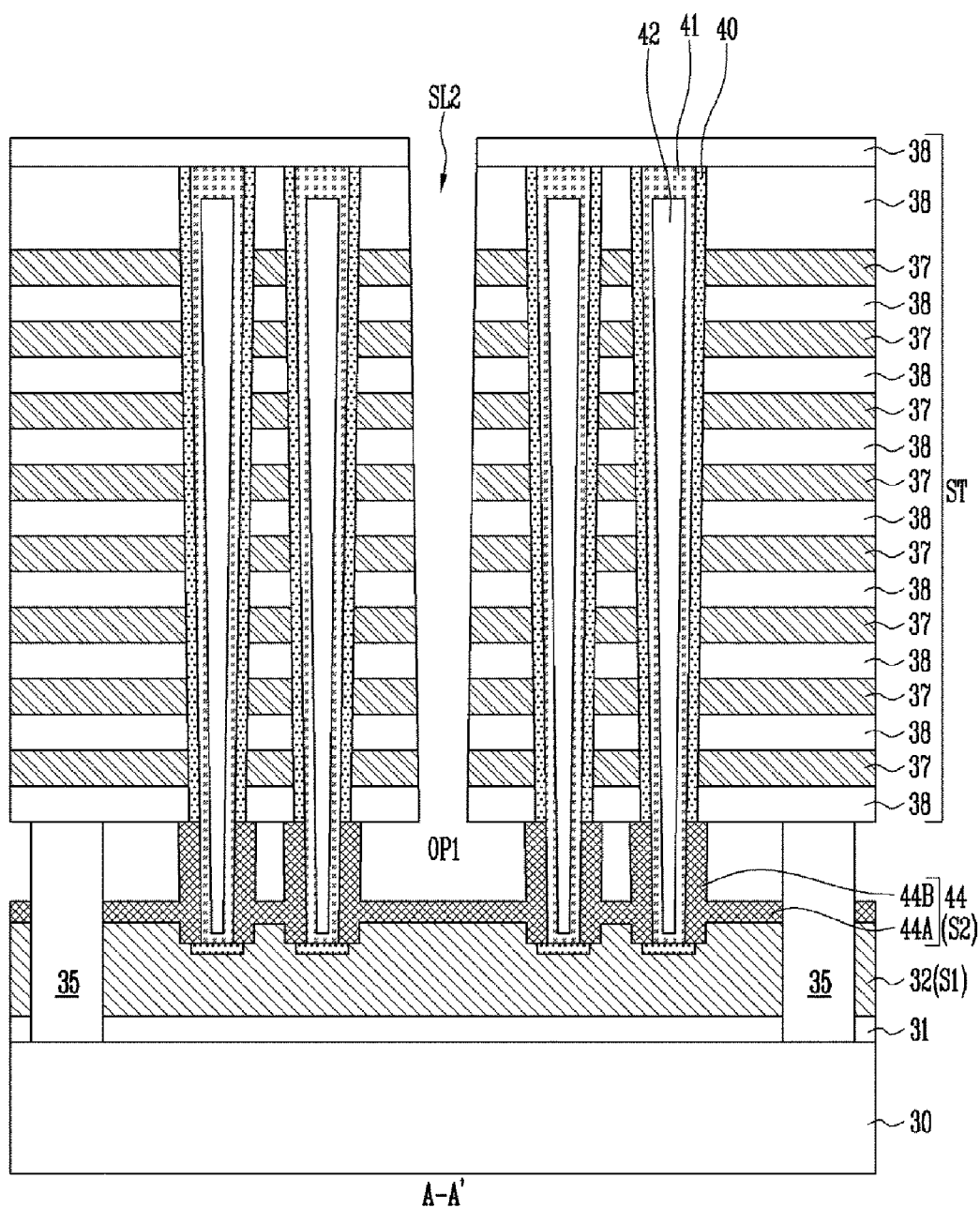

Referring to FIG. 4E, the second conductive layer 44 may be formed over the semiconductor layers 41 and the first conductive layer 32 exposed through the first opening OP1. The second conductive layer 44 may be a second source layer (S2). The second conductive layer 44 may directly contact the semiconductor layer 41 and the first conductive layer 32 and may be a doped polysilicon layer.

For example, the second conductive layer 44 may be grown by selective growth, so that the second conductive layer 44 may be grown from the semiconductor layers 41 and the first conductive layer 32 exposed through the first opening OP1. Therefore, the second conductive layer 44 may include a first region 44A contacting the first conductive layer 32 and extending in a horizontal direction and a second region 44B contacting the semiconductor layer 41 and extending in substantially a vertical direction.

Figure 5A:
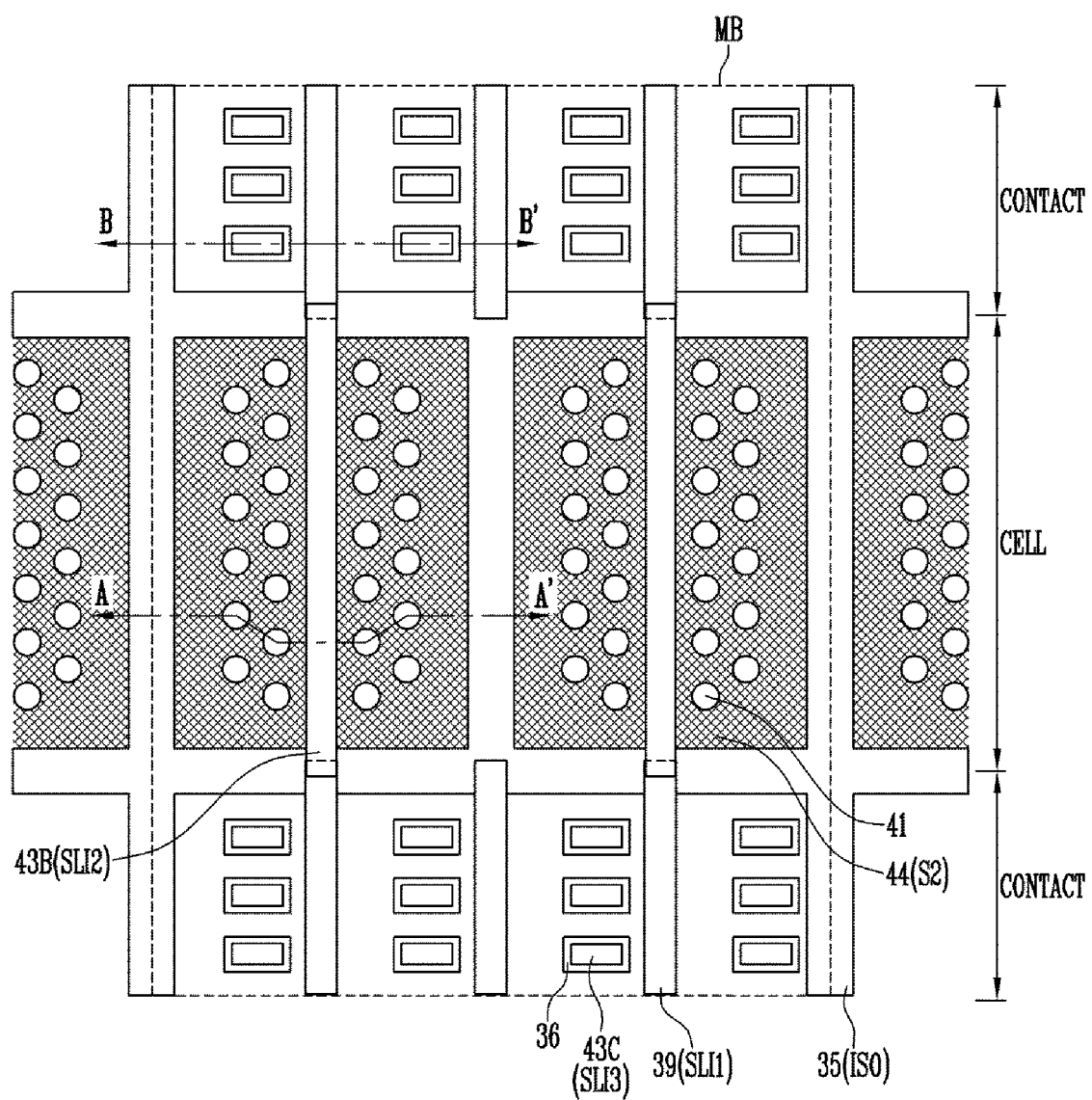
Figure 5B:
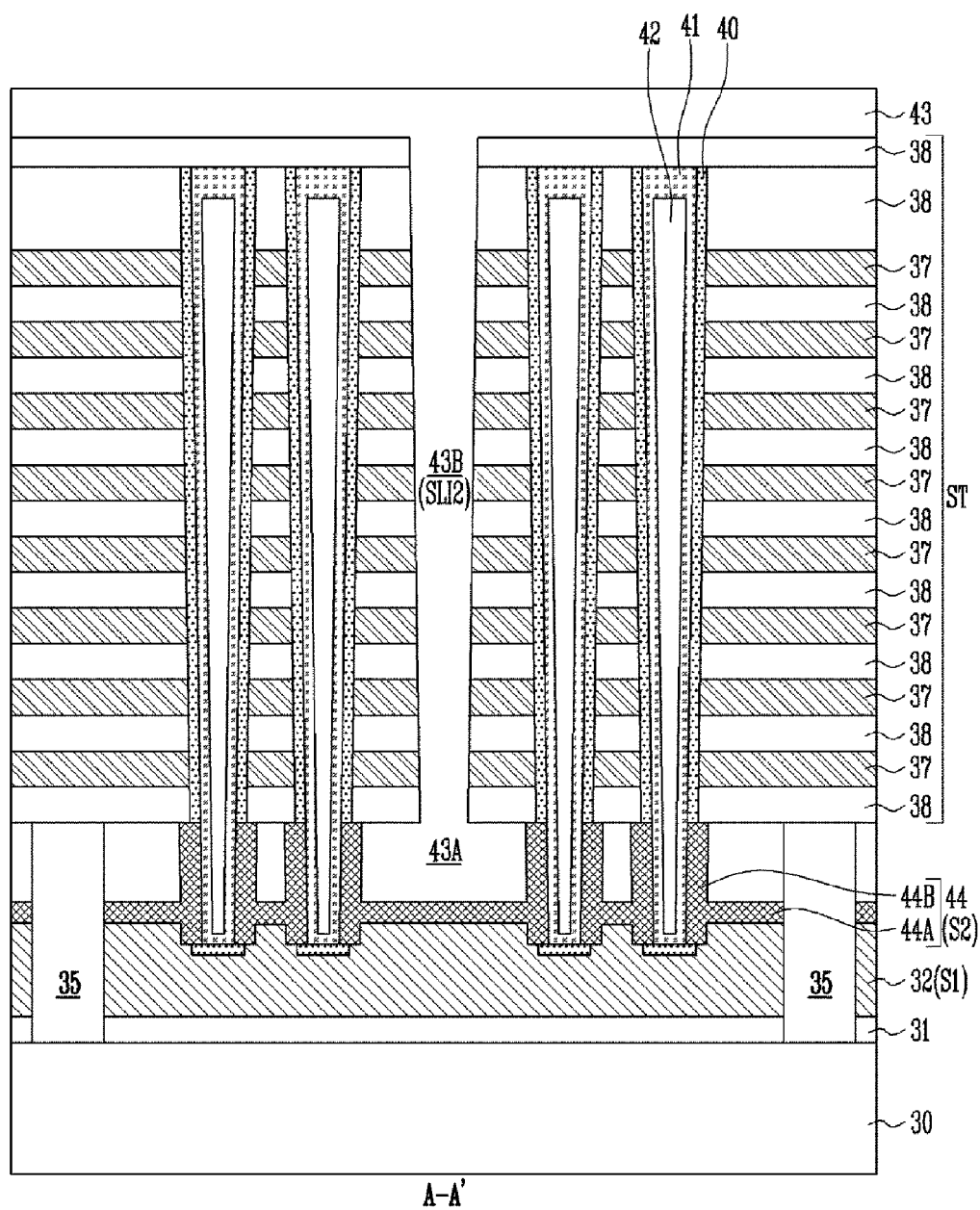
Figure 5C:
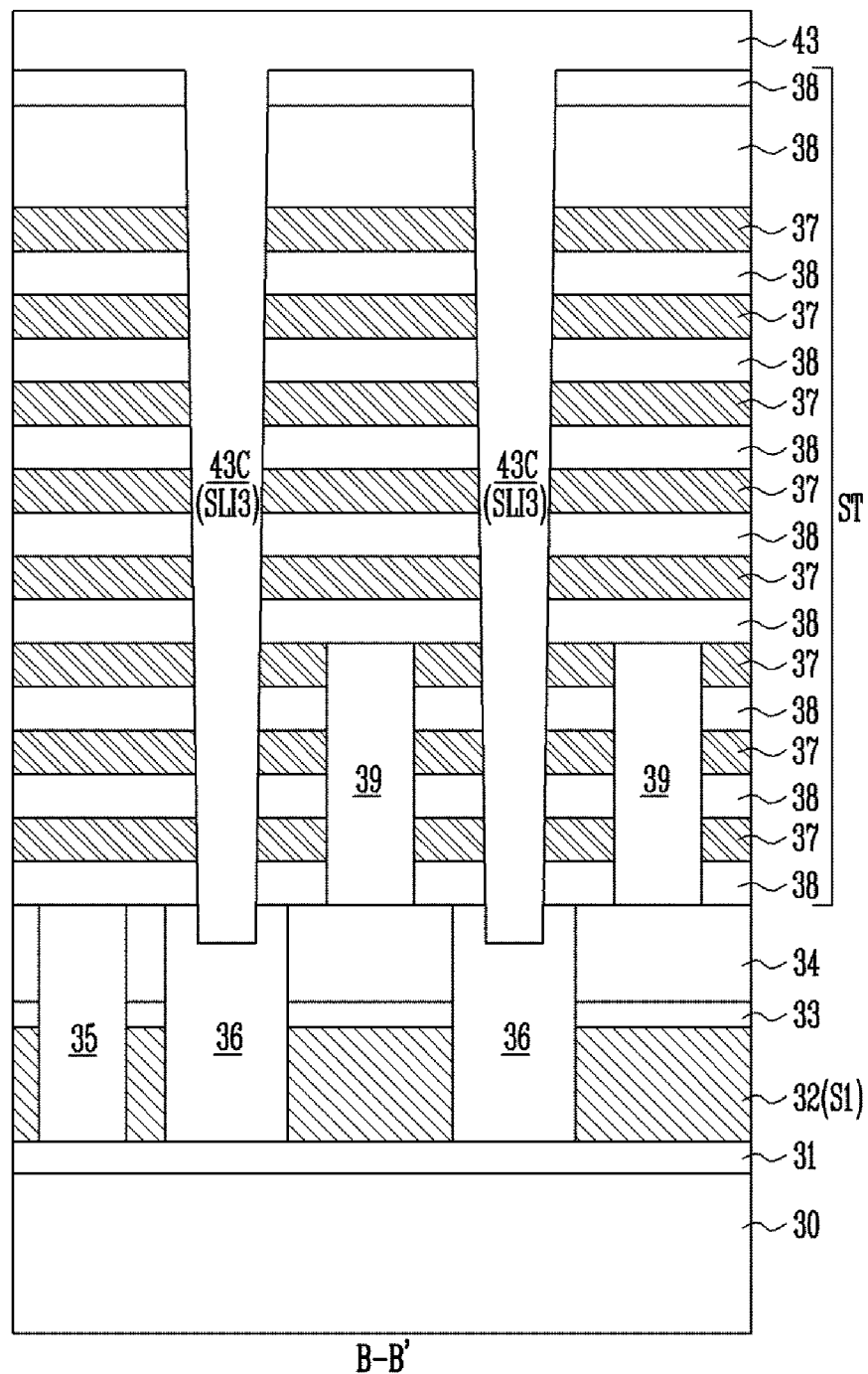

Referring to FIGS. 5A to 5C, a fifth insulating layer 43 may be formed in the first opening OP1, the second slit SL2 and the third slit SL3. Therefore, a fifth insulating layer 43A may be formed in the first opening OP1, a fifth insulating layer 43B may be formed in the second slit SL2, and a fifth insulating layer 43C may be formed in the third slit SL3.

The fifth insulating layer 43B may be a second slit insulating layer (SLI2). The fourth insulating layer 39 may be a first slit insulating layer (SLI1). Therefore, the fifth insulating layer 43B and the fourth insulating layer 39 may be coupled to each other and extend in one direction, and pattern the lower stacked structure located in the cell region CELL and the contact region CONTACT in a line shape. In addition, the fifth insulating layers 43C may be located over the third insulating layers 36 and have a smaller width than the third insulating layers 36. The fifth insulating layer 43C may be a third slit insulating layer (SLI3) and function as a support body when the first material layers 37 are removed during subsequent processes.

Figure 6A:
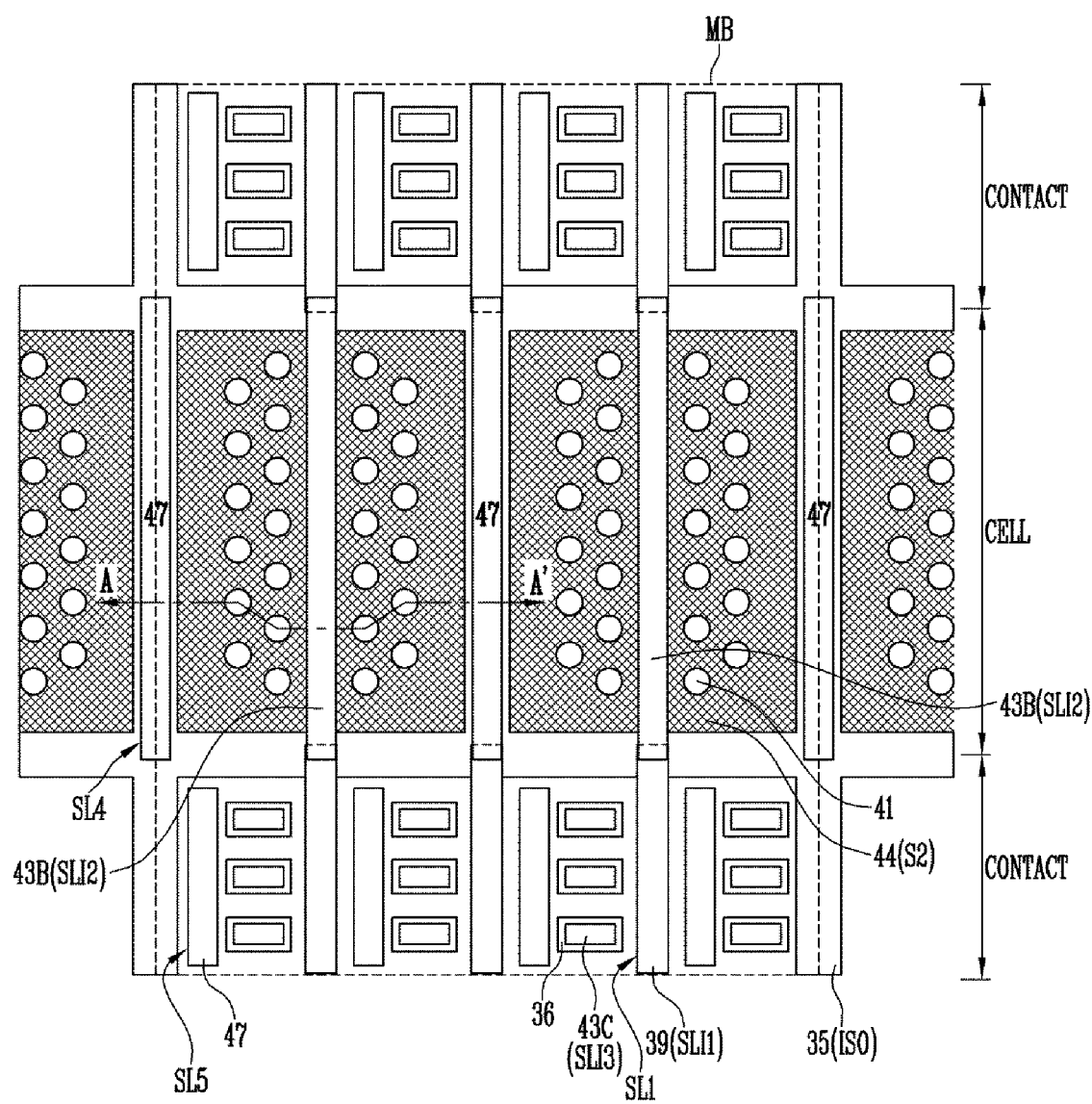
Figure 6B:
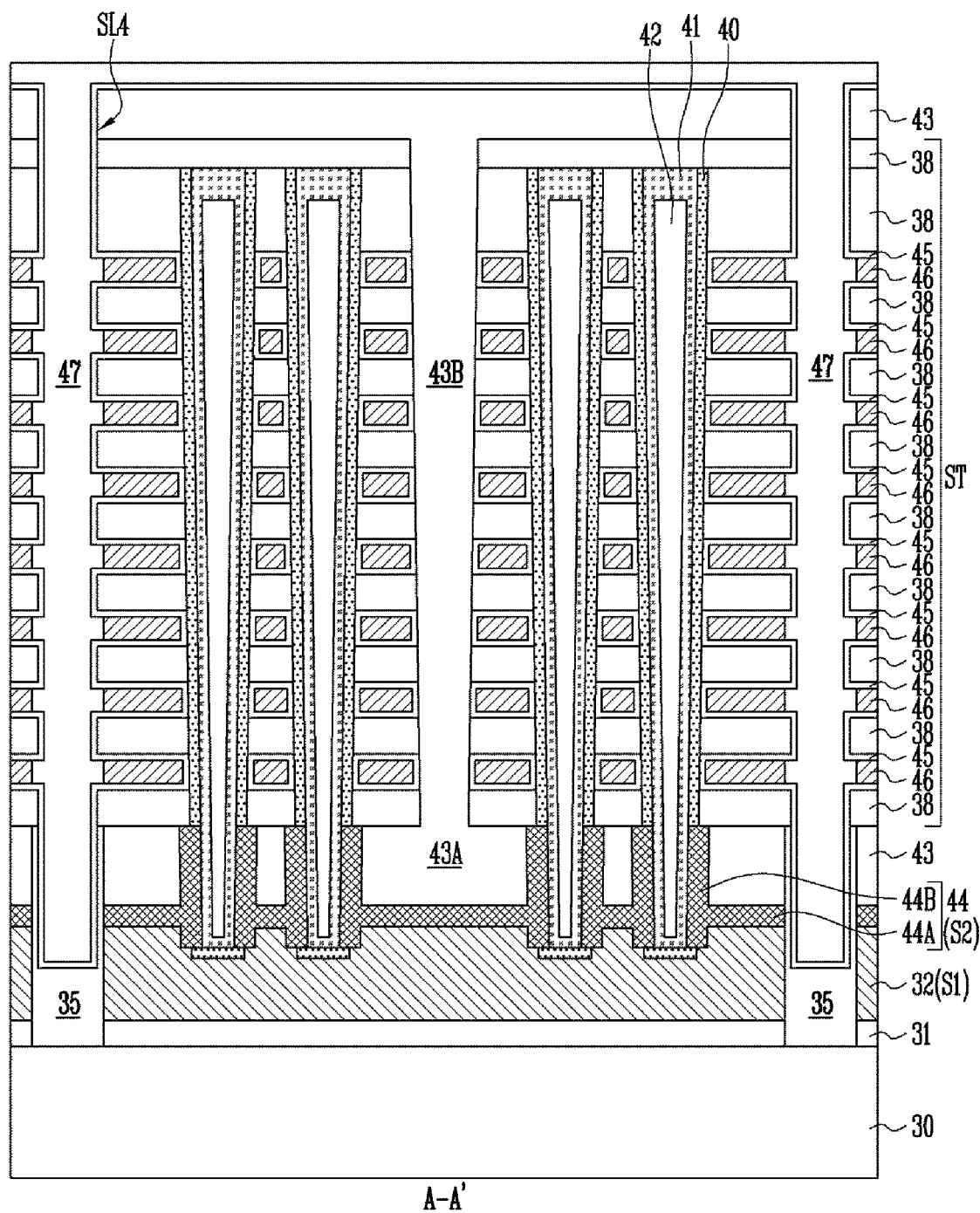

Referring to FIGS. 6A and 6B, fourth and fifth slits SL4 and SL5 may be formed through the stacked structure ST. The fourth slits SL4 may be located in the cell region CELL and/or the contact region CONTACT. The fourth slits SL4 located in the cell region CELL may be located over the second insulating layer 35 and be deep enough to partially etch the second insulating layer 35. The fifth slits SL5 located in the contact region CONTACT may be located between the fourth insulating layer 39 and the fifth insulating layer 43C.

The first material layers 37 exposed through the fourth slits SL4 may be removed. The fifth insulating layers 43B and 43C may function as a support body supporting the remaining second material layers 38. Third conductive layers 46 may be formed in regions from which the first material layers 37 are removed. The third conductive layers 46 may be gate electrodes of memory cells or selection transistors and may include, for example but not limited to, tungsten, tungsten nitride, titanium, titanium nitride, tantalum, tantalum nitride, or the like. In addition, before the third conductive layers 46 are formed, charge blocking layers 45 may be further formed in regions from which the first material layers 37 are removed. Subsequently, sixth insulating layers 47 may be formed in the fourth and fifth slit SL4 and SL5.

According to the above-described processes, a height to which the multilayer dielectric layers 40 are exposed, i.e., the height to which the multilayer dielectric layers 40 are removed may be controlled by the height of the first opening OP1. Therefore, the second conductive layer 44 may have a uniform height.

According to an embodiment, the first insulating layer 31 and the first conductive layer 32 may be formed over the substrate 30. However, these layers may not be formed. More specifically, a source region may be defined by doping a surface of the substrate 30 with impurities by a predetermined depth. The holes H may be deep enough to pass through the stacked structure ST and extend to the substrate 30, and contact the source region in the substrate 30.

In addition, the above-described processes may be changed according to materials of the first and second material layers 37 and 38. For example, when the first material layer 37 includes a conductive layer, and the second material layer 38 includes a sacrificial layer, the second material layer 38 may be removed instead of the first material layer 37, and insulating layers may be formed in regions from which the second material layers 38 are removed. In other examples, when the first material layer 37 includes a conductive layer and the second material layer 38 includes an insulating layer, the process of removing the first material layer 37 may be omitted. Instead, a process of siliciding the first material layers 37 exposed through the third slit SL3 may be further performed.

Figure 7:
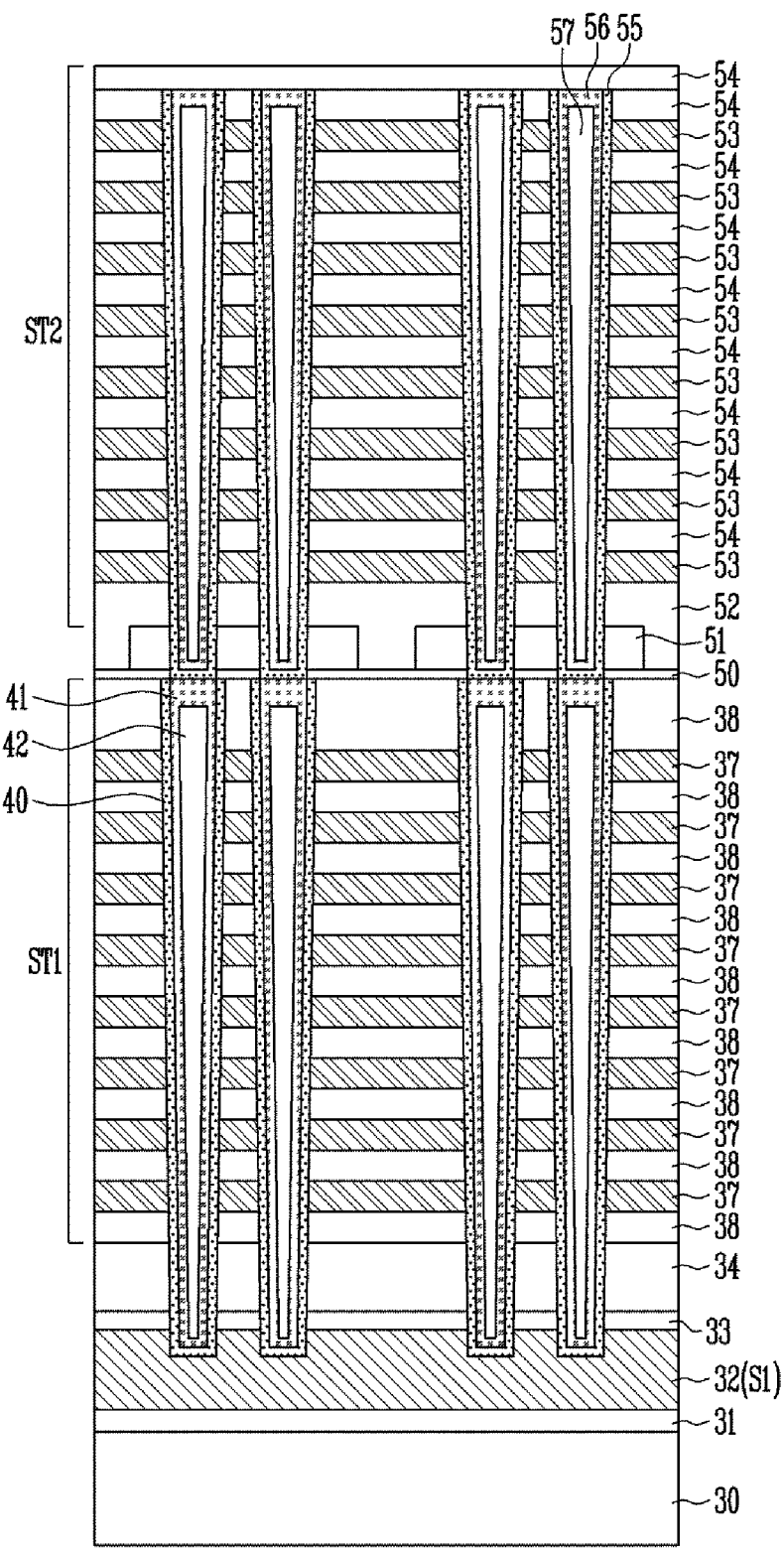
FIGS. 7 to 9 are cross-sectional diagrams illustrating a representation of a method of manufacturing a semiconductor device according to an embodiment.
Figure 8:
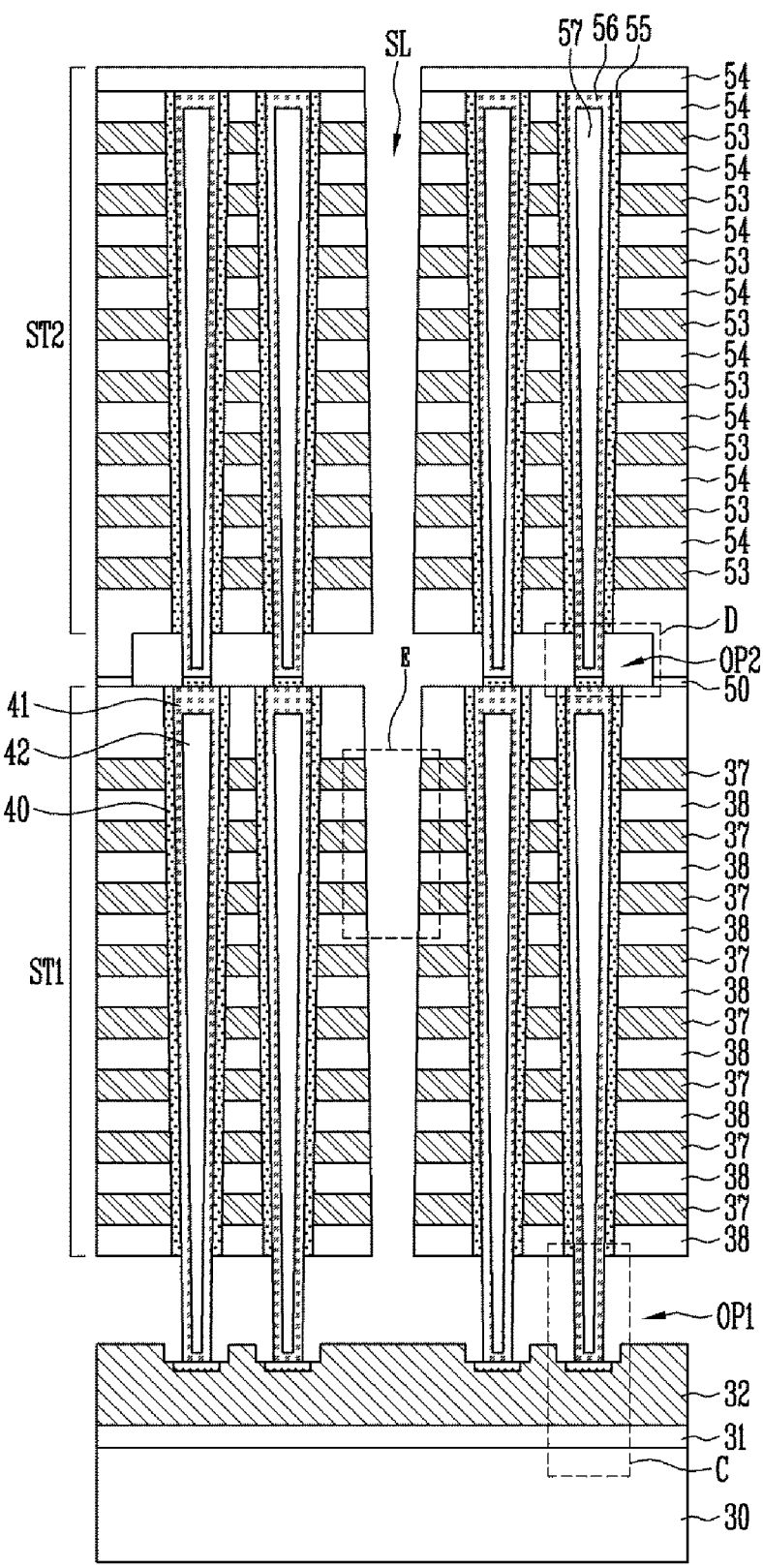
Figure 9:
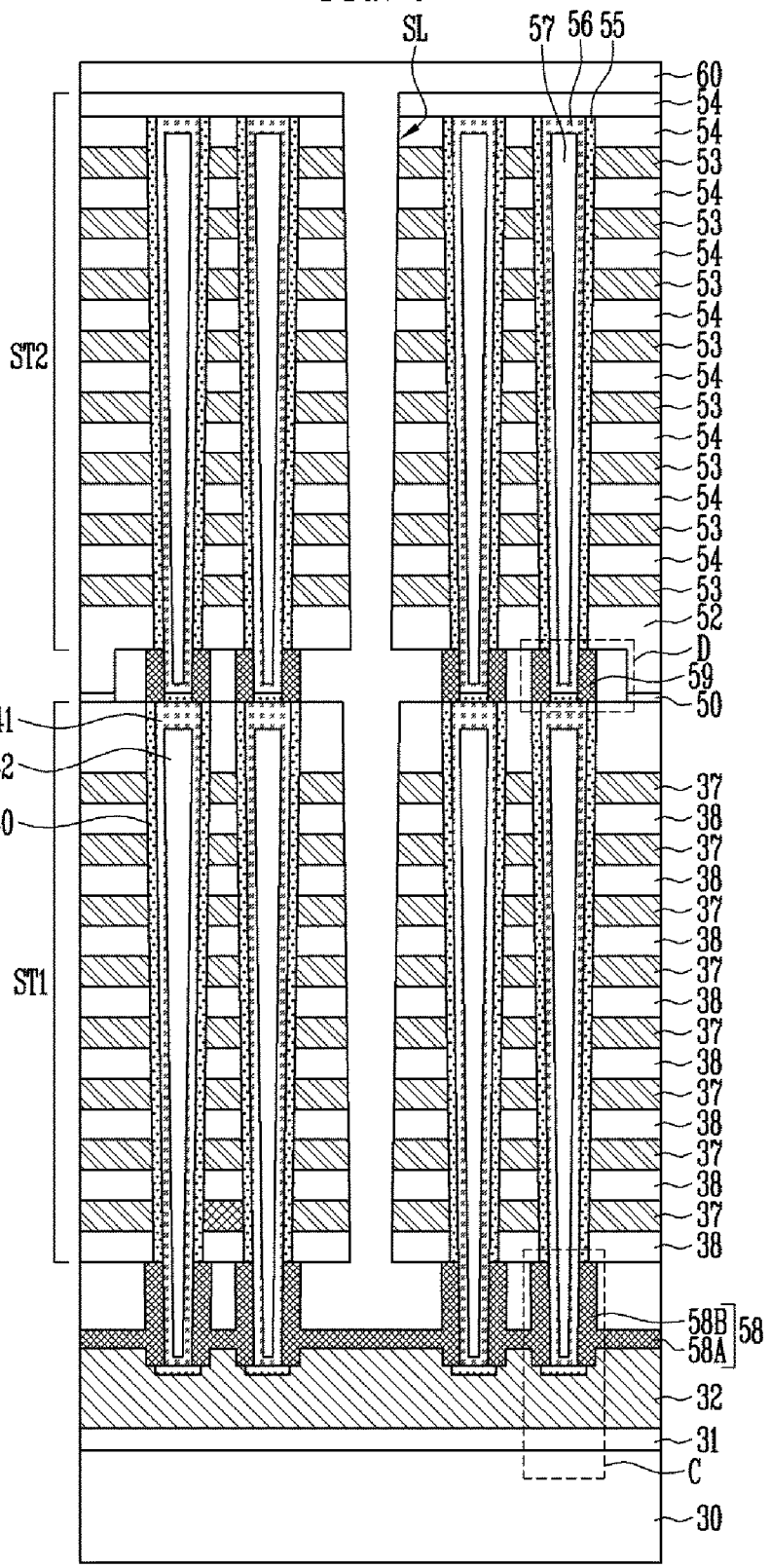
Figure 10A:
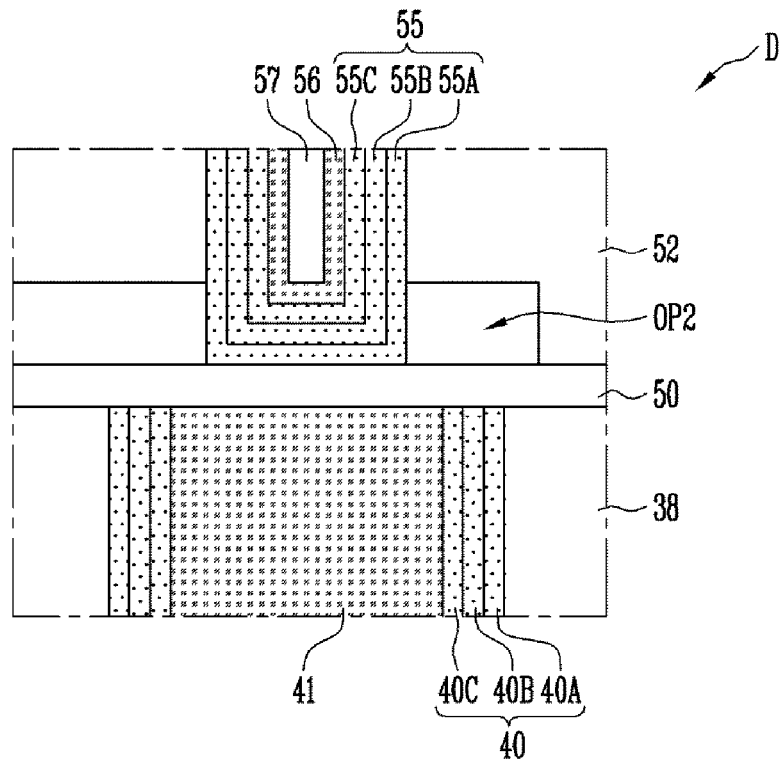
Figure 10B:
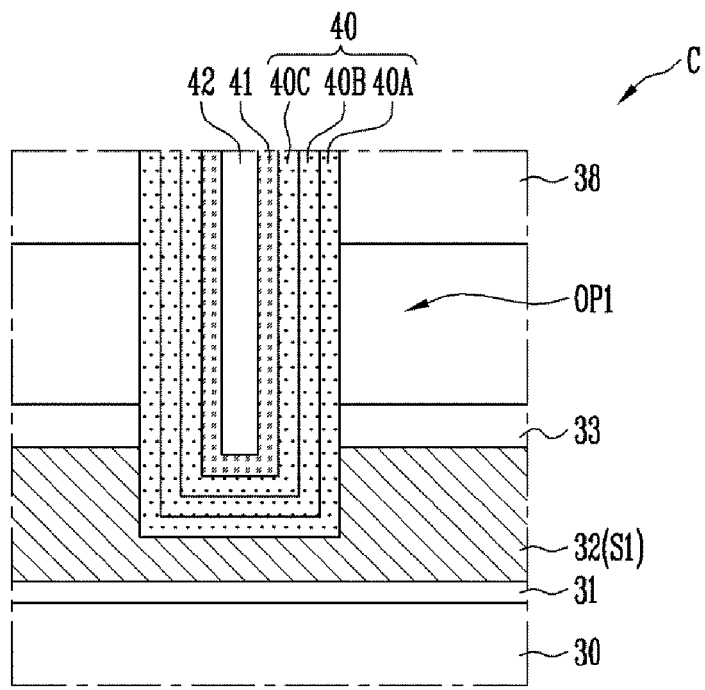
Figure 10C:
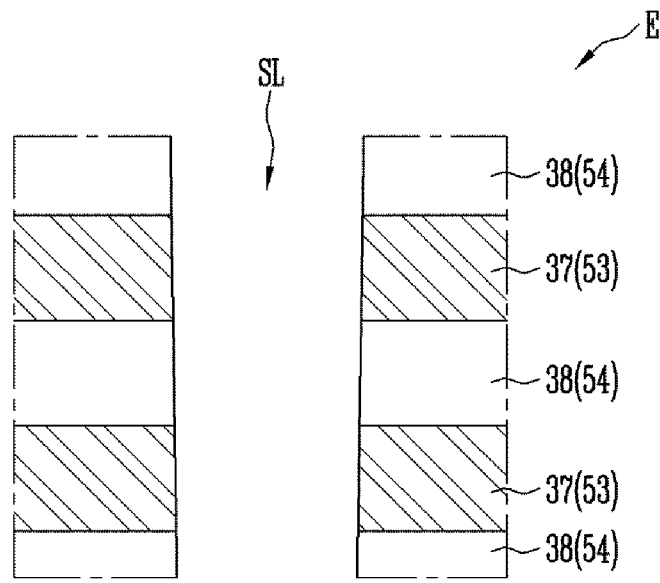

FIGS. 7 to 9 are cross-sectional views illustrating a representation of a method of manufacturing a semiconductor device according to an embodiment. Hereinafter, a description of common contents with earlier described embodiments is omitted.

Referring to FIG. 7, the first insulating layer 31, the first conductive layer 32, the first sacrificial layer 33 and the second sacrificial layer 34 may be formed over the substrate 30. The first stacked structure ST1 including the first material layers 37 and the second material layers 38 stacked alternately with each other may be formed. The first multilayer dielectric layer 40, the first semiconductor layer 41 and the first gap-filling insulating layer 42 may be formed through the first stacked structure ST1.

Subsequently, a third sacrificial layer 50 and fourth sacrificial layers 51 may be sequentially formed over the first stacked structure ST1. The fourth sacrificial layers 51 may be formed to ensure regions in which coupling patterns for coupling the first semiconductor layers 41 and second semiconductor layers to be formed during subsequent processes are formed. Thus, the fourth sacrificial layer 51 may be located over at least one first semiconductor layer 41. For example, the third sacrificial layer 50 may include an oxide, and the fourth sacrificial layers 51 may include undoped polysilicon.

The fourth sacrificial layers 51 may be formed in a second insulating layer 52. For example, after the second insulating layer 52 is primarily formed over the first stacked structure ST1, the second insulating layer 52 may be partially etched to form trenches. After the fourth sacrificial layers 51 are formed in the trenches, the second insulating layers 52 may be secondarily formed. In other examples, after the second insulating layer 52 is formed over the first stacked structure ST1, the fourth sacrificial layers 51 having a desired pattern may be formed over the second insulating layer 52. Subsequently, another second insulating layer 52 may be secondarily formed over the second insulating layer 52 in which the fourth sacrificial layers 51 are formed.

Subsequently, the second stacked structure ST2 including first material layers 53 and second material layers 54 stacked alternately with each other may be formed over the second insulating layer 52. Subsequently, second multilayer dielectric layers 55, second semiconductor layers 56 and second gap-filling insulating layers 57 may be formed through the second stacked structure ST2. The second semiconductor layers 56 may be located at positions substantially corresponding to the first semiconductor layers 41, respectively.

Referring to FIG. 8, the slit SL may be formed through the second stacked structure ST2, the second insulating layer 52 (see FIG. 7), the first stacked structure ST1, the fourth sacrificial layers 51 (see FIG. 7) and the second sacrificial layer 34 (see FIG. 7). The second sacrificial layer 34 and the fourth sacrificial layers 51 exposed through the slit SL may form the first opening OP1 and the second opening OP2. As a result, a portion of the first multilayer dielectric layer 40 may be exposed through the first opening OP1, and a portion of the second multilayer dielectric layer 55 may be exposed through the second opening OP2.

Subsequently, the first and second multilayer dielectric layers 40 and 55 exposed through the first and second openings OP1 and OP2 may be removed. As a result, portions of the first semiconductor layers 41 may be exposed through the first opening OP1, and portions of the second semiconductor layer 56 may be exposed through the second opening OP2.

Referring to FIG. 9, a second conductive layer 58 may be formed over the first conductive layer 32 and the first semiconductor layers 41 may be exposed through the first opening OP1 (see FIG. 8). For example, the second conductive layer 58 including a first region 58A extending in a horizontal direction and a second region 58B extending in a vertical direction may be grown by selective growth. As a result, the second conductive layer 58 including silicon may be formed.

In addition, coupling patterns 59 may be formed over the first semiconductor layer 41 and the second semiconductor layer 56 exposed through the second opening OP2 (see FIG. 8). For example, the coupling patterns 59 may be grown from the first semiconductor layers 41 and the second semiconductor layers 56 by selective growth. Growing conditions may be controlled so that neighboring coupling patterns 59 may not be coupled to each other. As a result, the coupling patterns 59 including silicon may be formed. Subsequently, a third insulating layer 60 may be formed in the first opening OP1, the second opening OP2 and the slit SL.

According to the above-described processes, since semiconductor layers having a high aspect ratio are formed in two steps, the processes of manufacturing the semiconductor device may become easier to perform. In addition, since the coupling patterns for coupling the first semiconductor layers 41 and the second semiconductor layers 56 are formed by selective growth, contact resistance between the first semiconductor layer 41 and the second semiconductor layer 56 may be reduced. In addition, since the coupling patterns 59 and the second conductive layers 58 are formed at the same time or substantially the same time, the processes of manufacturing the semiconductor device may be simplified.

FIGS. 10A to 14A, FIGS. 10B to 14B, and FIGS. 10C to 13C are enlarged views illustrating a representation of a method of manufacturing a semiconductor device according to an embodiment. FIGS. 10A to 14A correspond to a region D in FIG. 4D or 8. FIGS. 10B to 14B correspond to a region C in FIG. 8. FIGS. 10C to 13C correspond to a region E in FIG. 4D or 8.

Referring to 10A to 10C, the first multilayer dielectric layer 40 may include a first charge blocking layer 40A, a first data storage layer 40B and a first tunnel insulating layer 40C. The second multilayer dielectric layer 55 may include a second charge blocking layer 55A, a second data storage layer 55B and a second tunnel insulating layer 55C. The first charge blocking layer 40A may be exposed through the first opening OP1, and the second charge blocking layer 55A may be exposed through the second opening OP2. In addition, the first material layers 37 and 53 and the second material layers 38 and 54 may be exposed through the slit SL.

Figure 11A:
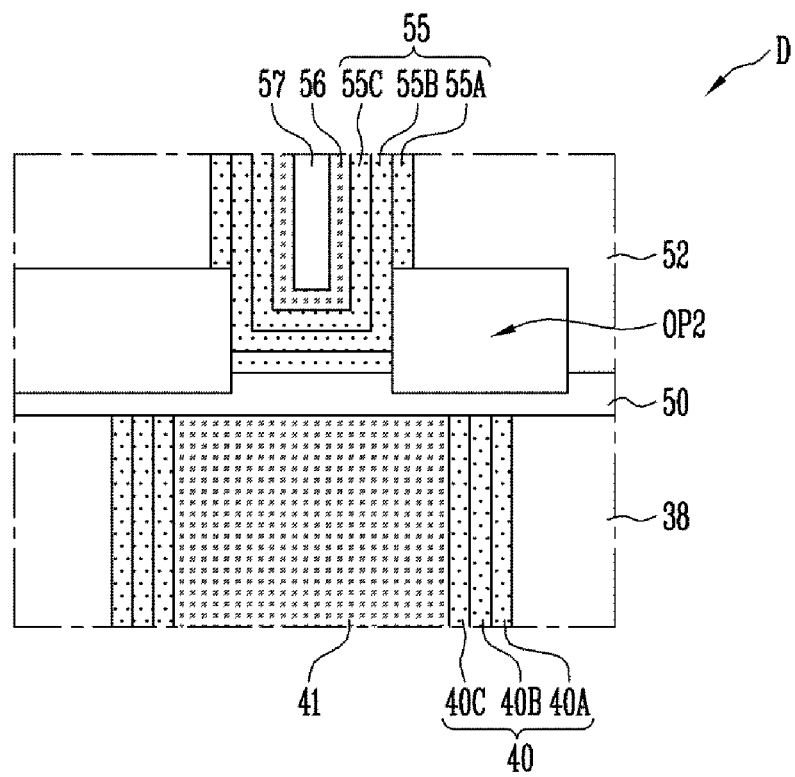
Figure 11B:
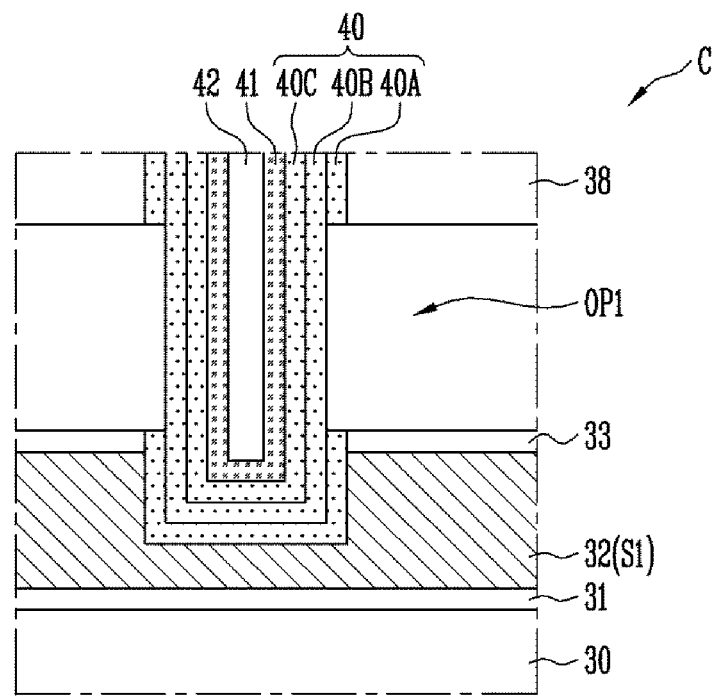
Figure 11C:
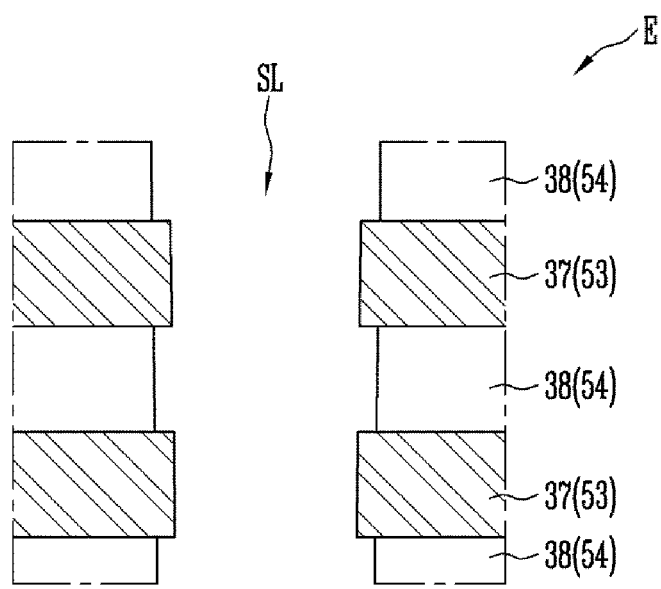

Referring to FIG. 11A to 11C, the first and second charge blocking layers 40A and 55A exposed through the first and second openings OP1 and OP2 may be removed. As a result, the first and second data storage layers 40B and 55B may be exposed through the first and second openings OP1 and OP2. When the first and second charge blocking layers 40A and 55A and the second material layers 38 and 54 include oxides, the second material layers 38 and 54 exposed through the slit SL may be etched by a predetermined thickness when the first and second charge blocking layers 40A and 55A are etched. In these examples, the first material layers 37 and 53 may protrude further than the second material layers 38 and 54, so that irregularities may be formed on inner walls of the slit SL.

In addition, when the first and second charge blocking layers 40A and 55A, the second insulating layer 52, the first sacrificial layer 33 and the third sacrificial layer 50 include oxides, these layers may be partially etched when the first and second charge blocking layers 40A and 55A are etched. Therefore, the first and second openings OP1 and OP2 may be extended.

Figure 12A:
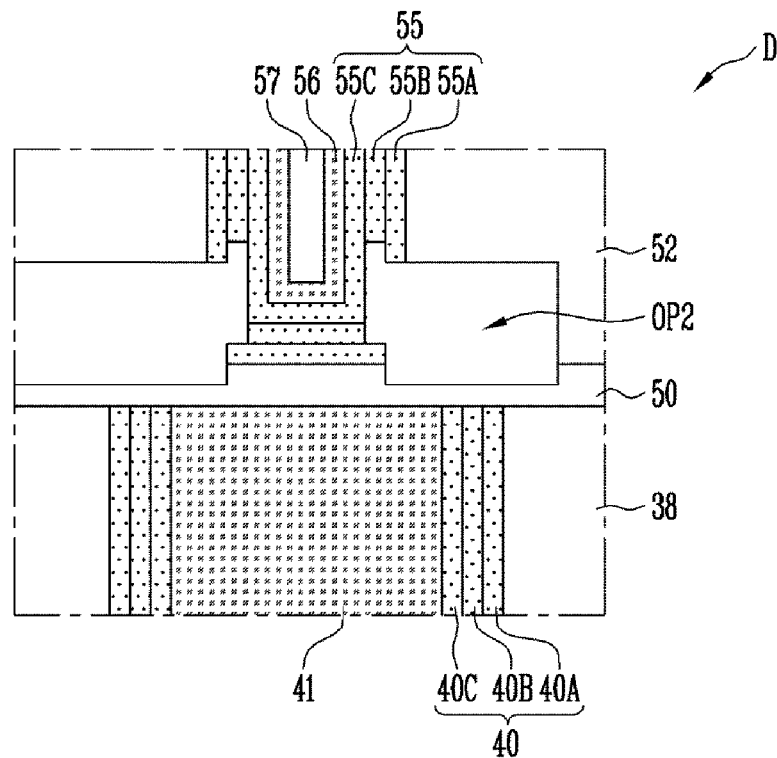
Figure 12B:
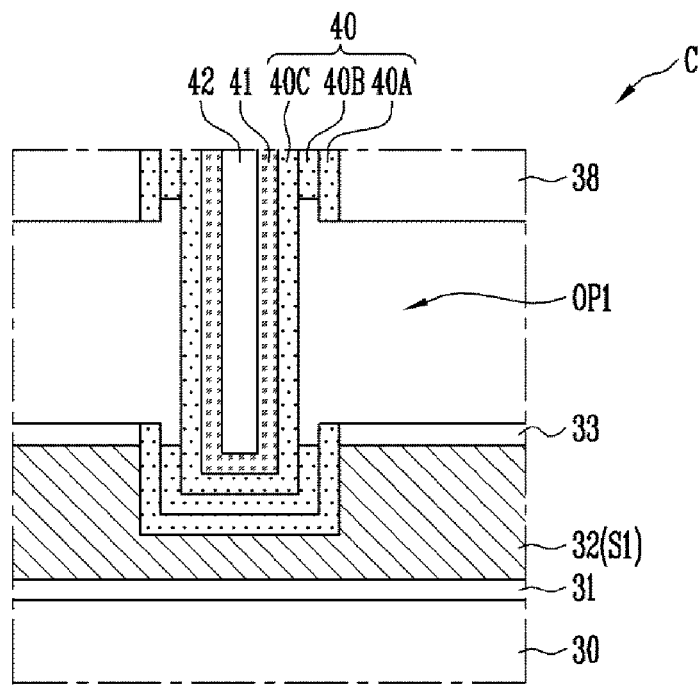
Figure 12C:
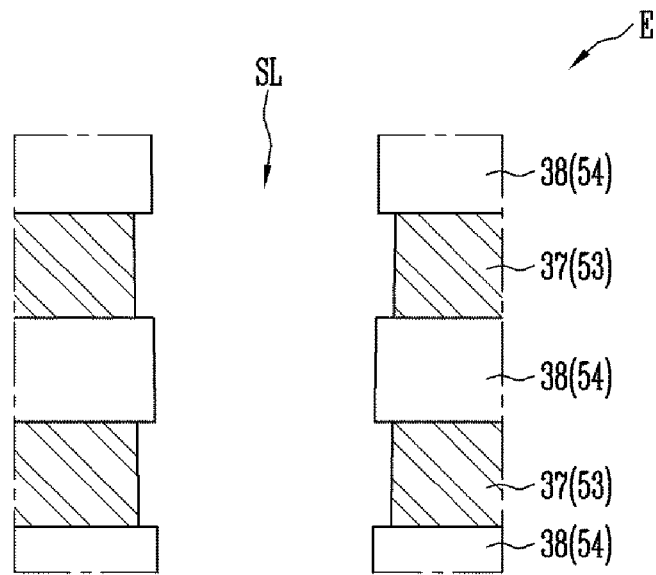

Referring to FIGS. 12A to 12C, the first and second data storage layers 40B and 55B exposed through the first and second openings OP1 and OP2 may be removed. As a result, the first and second charge blocking layers 40A and 55A may be exposed through the first and second openings OP1 and OP2. When the first and second data storage layers 40B and 55B and the first material layers 37 and 53 include nitrides, portions of the first material layers 37 and 53 may be etched when the first and second data storage layers 40B and 55B are etched. The irregularities on the inner walls of the slit SL may be removed or relieved depending on the amount of the first material layers 37 and 53 removed. Alternatively, the second material layers 38 may protrude further than the first material layers 37.

Figure 13A:
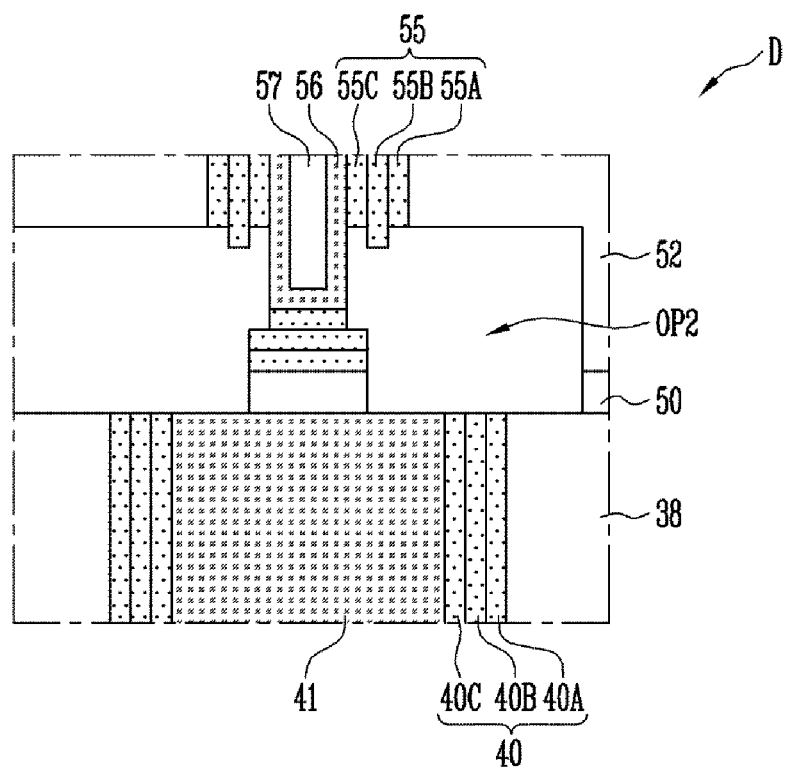
Figure 13B:
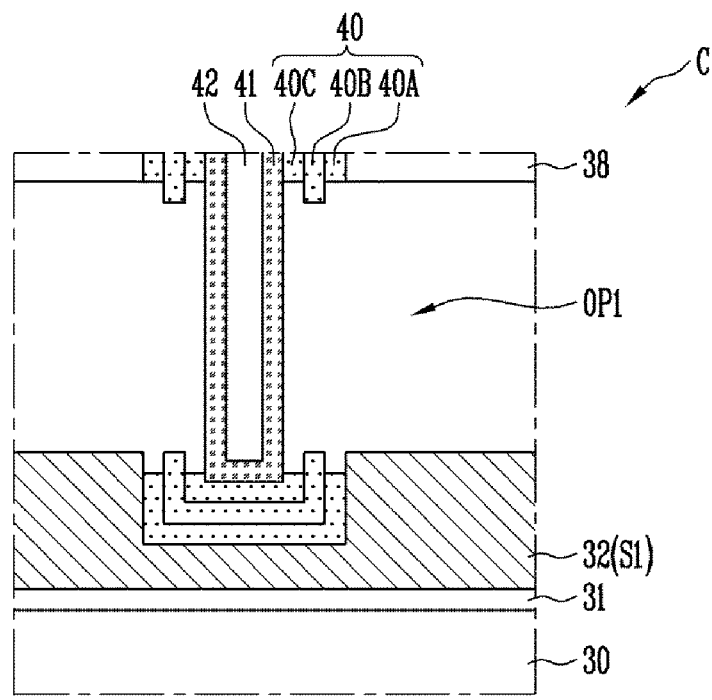
Figure 13C:
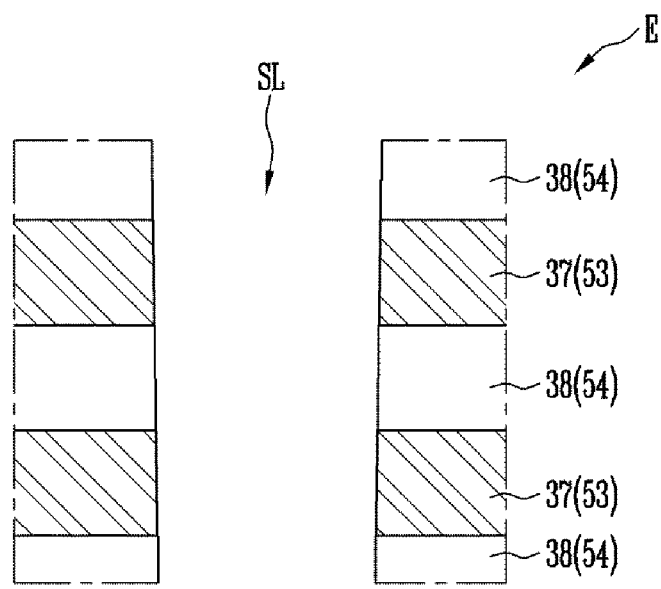

Referring to FIGS. 13A to 13C, the first and second tunnel insulating layers 40C and 55C exposed through the first and second openings OP1 and OP2 may be removed, so that the first and second semiconductor layers 41 and 56 exposed through the first and second openings OP1 and OP2 may be exposed. When the first and second tunnel insulating layers 40C and 55C and the second material layers 38 and 54 include oxides, portions of the second material layers 38 and 54 may be etched when the first and second tunnel insulating layers 40C and 55C are etched. Thus, irregularities on the inner walls of the slit SL may be relieved.

In addition, the remaining first sacrificial layer 33 may be completely removed, so that the first conductive layer 32 may be exposed through the first opening OP1. The third sacrificial layer 50 may be completely removed or partially removed so that the first semiconductor layer 41 may be exposed through the second opening OP2.

Figure 14A:
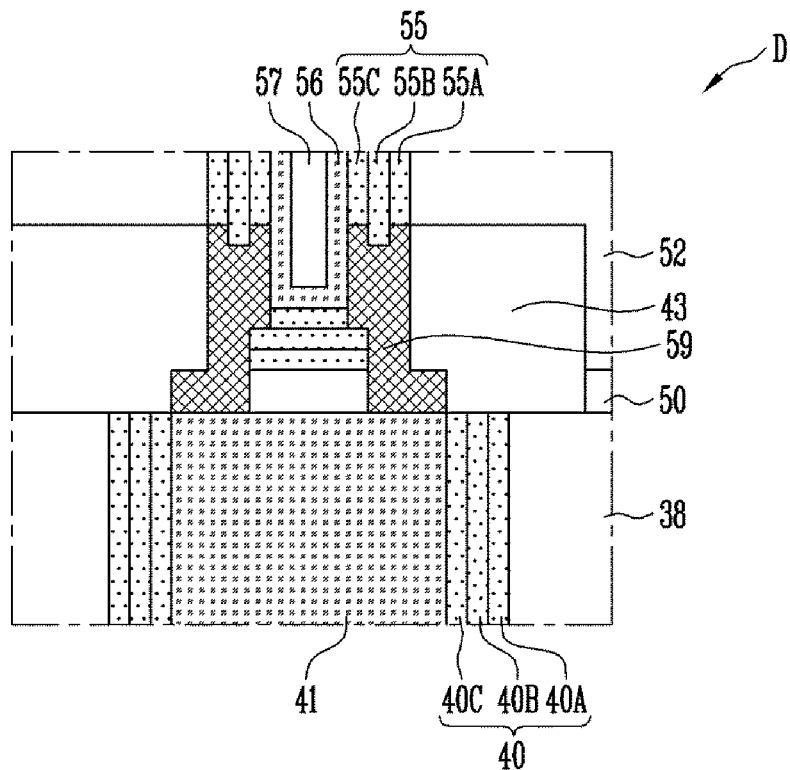
Figure 14B:
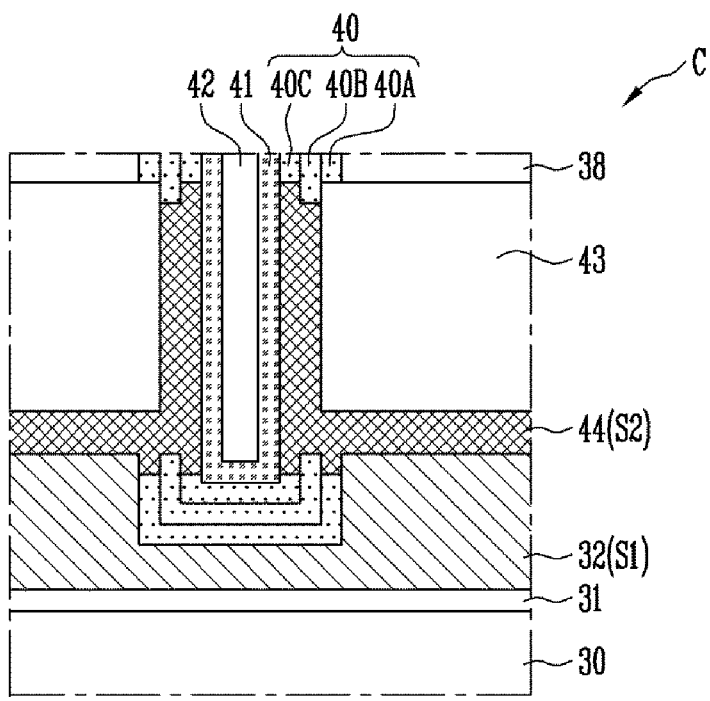

Referring to FIGS. 14A and 14B, the second conductive layer 44 may be formed over the first conductive layer 32 and the first semiconductor layer 41 exposed through the first opening OP1. In addition, the coupling pattern 59 may be formed over the first semiconductor layer 41 and the second semiconductor layer 56 exposed through the second opening OP2. For example, the second conductive layer 44 and the coupling pattern 59 may be formed by growing silicon layers by selective growth. Subsequently, the fifth insulating layer 43 may be formed in the first and second openings OP1 and OP2 (see FIGS. 13A and 13B).

The first multilayer dielectric layer 40 may remain in the first conductive layer 32, depending on the depth of the hole H and conditions of the etch process, or the second multilayer dielectric layer 55 may remain in the first semiconductor layer 41. However, the first and second multilayer dielectric layers 40 and 55 may be completely removed.

Figure 15A:
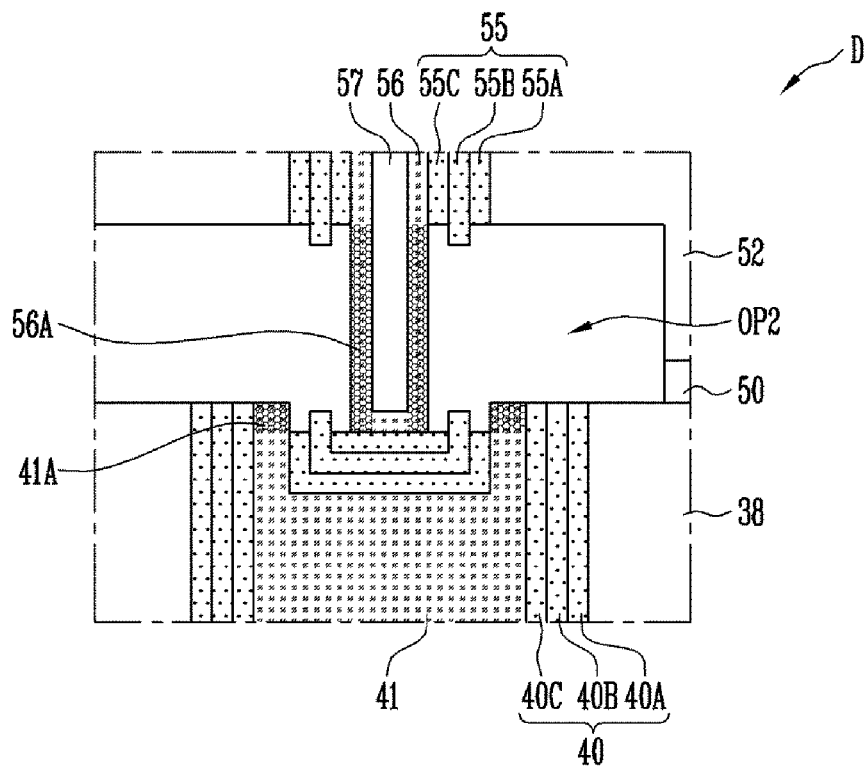
FIGS. 15A, 15B, 16A and 16B are enlarged views illustrating a representation of a method of manufacturing a semiconductor device according to an embodiment.
Figure 15B:
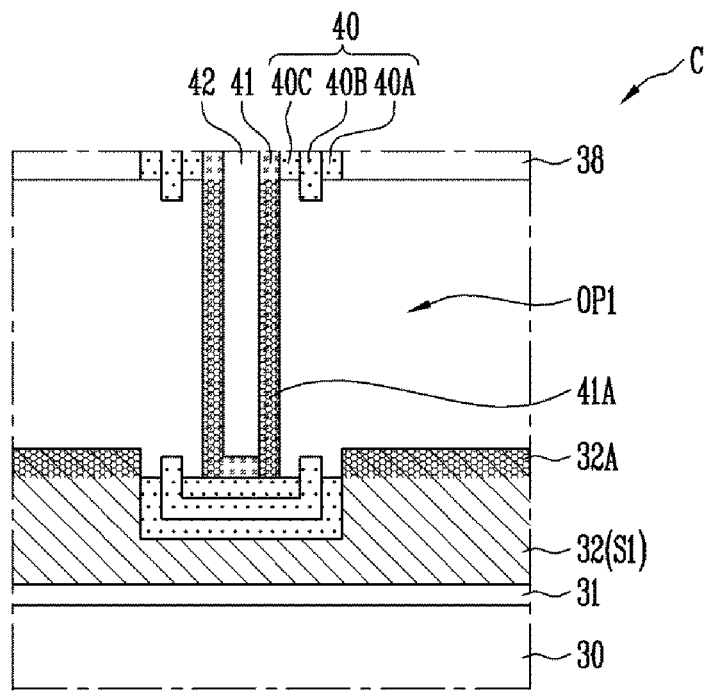
Figure 16A:
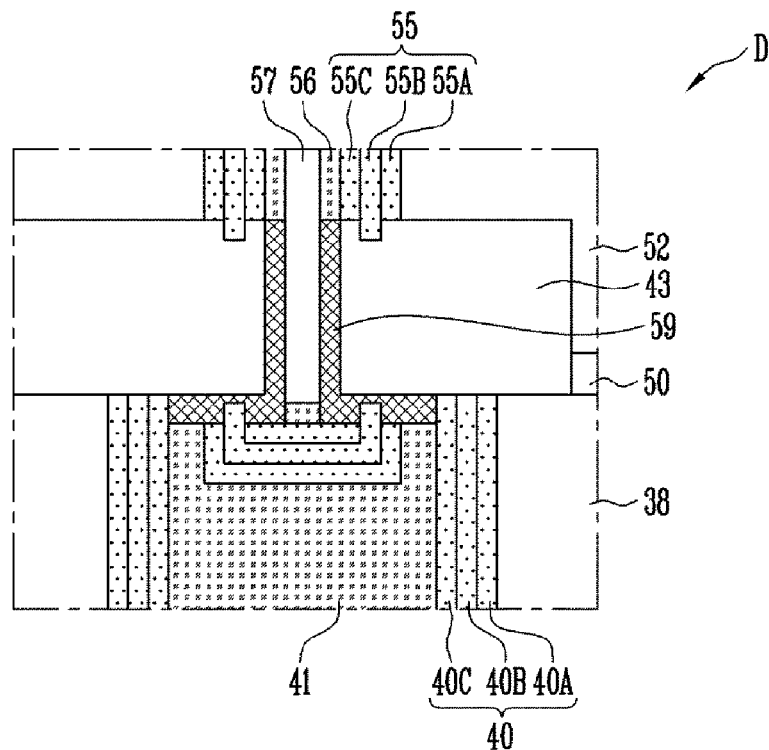

FIGS. 15A, 15B, 16A and 16B are enlarged views illustrating a representation of a method of manufacturing a semiconductor device according to an embodiment. FIGS. 15A and 16A correspond to a region D of FIG. 4D or 8.

Figure 16B:
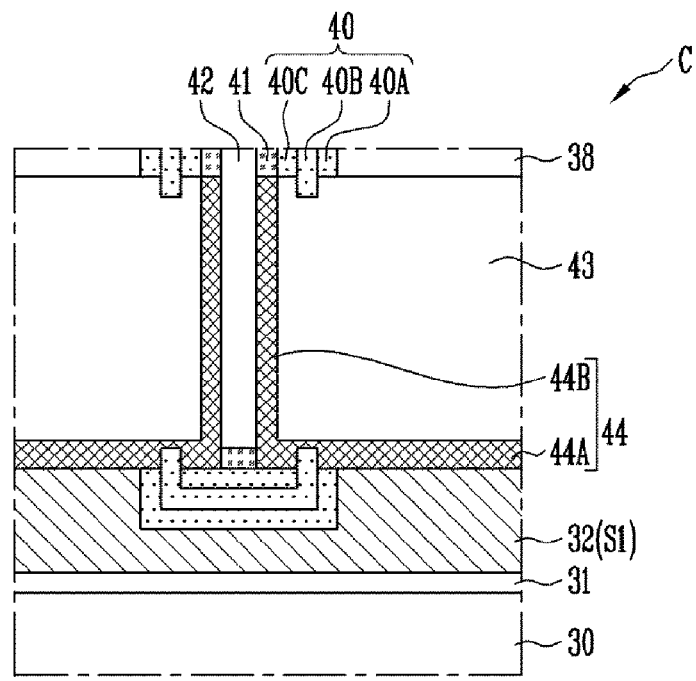

FIGS. 15B and 16B correspond to a region C of FIG. 8. Hereinafter, a description of common contents with earlier described embodiments is omitted.

Referring to FIGS. 15A and 15B, the first multilayer dielectric layer 40 and the first sacrificial layer 33 exposed through the first opening OP1 may be removed. In addition, the second multilayer dielectric layer 55 and the third sacrificial layer 50 exposed through the second opening OP2 may be removed. Therefore, the first semiconductor layer 41 and the first conductive layer 32 may be exposed through the first opening OP1, and the first semiconductor layer 41 and the second semiconductor layer 56 may be exposed through the second opening OP2.

Subsequently, the exposed first semiconductor layer 41, the second semiconductor layer 56 and first conductive layer 32 may be doped with impurities. For example, a thermal process may be performed in a gas atmosphere including impurities such as $PH_3$ gas, or a plasma doping process using N type impurities including As, P and the like may be performed. As a result, impurity-doped regions 41A, 56A, and 32A may be formed.

Referring to FIGS. 16A and 16B, the impurity-doped regions 41A, 56A, and 32A may be silicided to form the second conductive layer 44 and the coupling pattern 59. For example, a metal layer may be formed over the impurity-doped regions 41A, 56A, and 32A through the slit SL and the first and second opening OP1 and OP2. The metal layer may include, for example but not limited to, cobalt, nickel and the like. Subsequently, the impurity-doped regions 41A, 56A, and 32A may be reacted to the metal layer through a thermal process to form silicide, so that the second conductive layer 44 and the coupling pattern 59 including silicide layers may be formed.

The impurity-doped region 41A formed in the first semiconductor layer 41 and the impurity-doped region 32A formed in the first conductive layer 32 may be coupled to each other to form the second conductive layer 44 including the first region 44A and the second region 44B. In addition, the impurity-doped region 41A formed in the first semiconductor layer 41 and the impurity-doped region 56A formed in the second semiconductor layer 56 may be coupled to form the coupling pattern 59.

Figure 17:
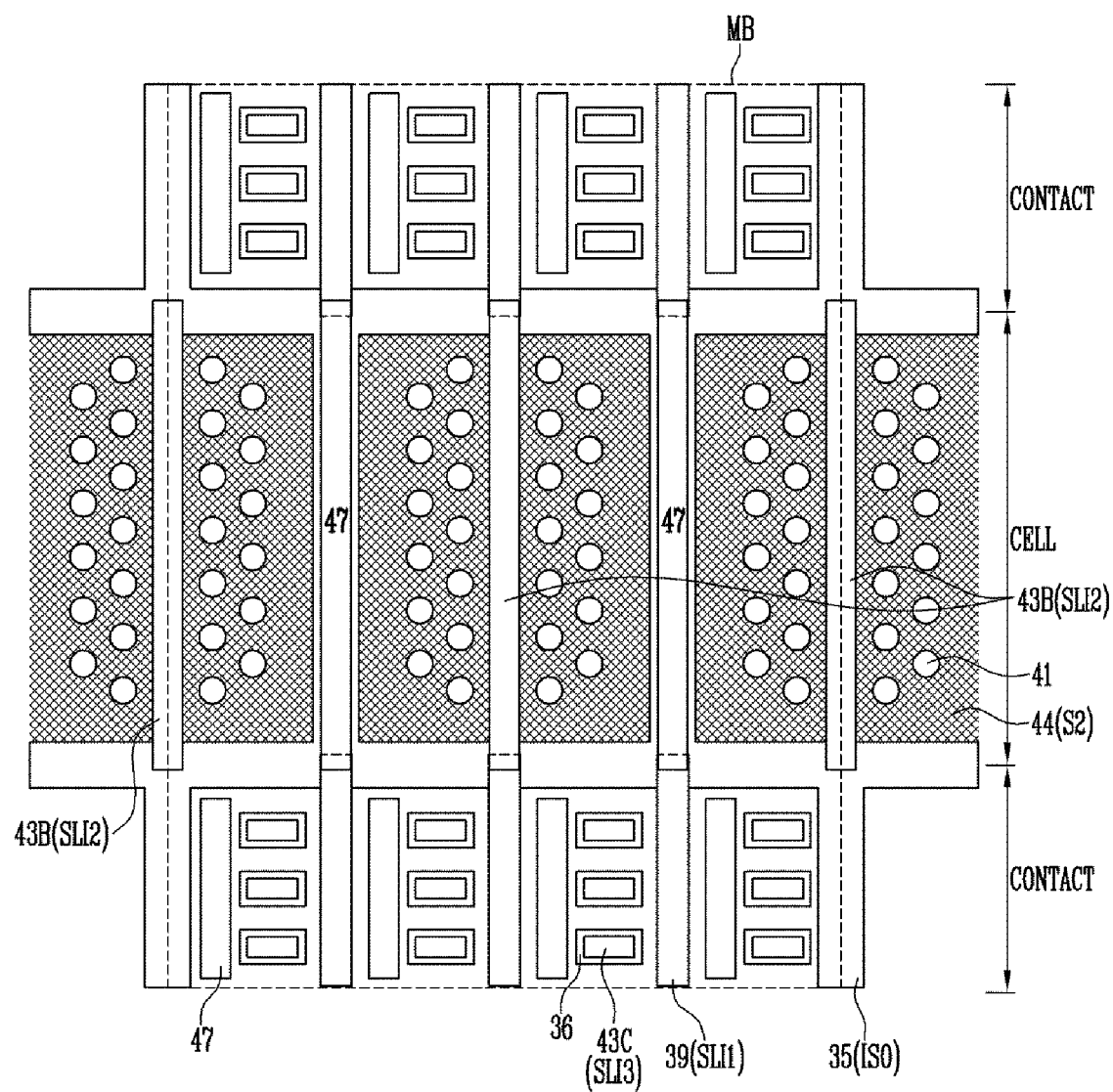
FIG. 17 is a representation of a layout of a semiconductor device according to an embodiment.

FIG. 17 is a layout illustrating a representation of a semiconductor device according to an embodiment. Referring to FIG. 17, positions of the fifth insulating layers 43B and the sixth insulating layers 47 may be swapped. For example, giving the sixth insulating layer 47 the position held by the fifth insulating layer 43B and giving the fifth insulating layer 43B the position held by the sixth insulating layer 47. In addition, the shape of the second insulating layer 35 may be changed. For example, the second insulating layer 35 may be located only in the contact region at the boundary between the memory blocks MB. The shape and position of an insulating layer, such as the second insulating layer 35, may be changed to various shapes and positions.

Figure 18:
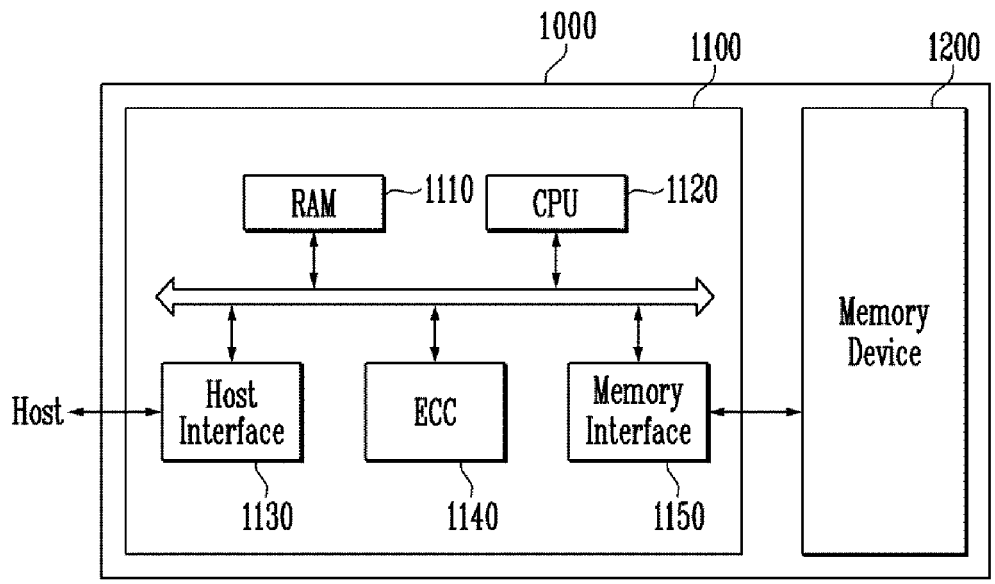
FIGS. 18 and 19 are block diagrams illustrating a representation of the configuration of a memory system according to an embodiment.

FIG. 18 is a block diagram illustrating a representation of the configuration of a memory system according to an embodiment.

As illustrated in FIG. 18, a memory system 1000 according to an embodiment may include a memory device 1200 and a controller 1100.

The memory device 1200 may be used to store data information including various types of data such as text, graphic and software codes. The memory device 1200 may be a non-volatile memory and may be, for example, the semiconductor device described above with reference to FIGS. 1A to 17. In addition, the memory device 1200 may include a first source layer, a first insulating layer over the first source layer, a first stacked structure over the first insulating layer, and first channel layers passing through the first stacked structure and the first insulating layer. The memory device 1200 may include a second source layer including a first region interposed between the first source layer and the first insulating layer and a second region interposed between the first channel layers and the first insulating layer. Since the memory device 1200 is configured and manufactured as described above, a detailed description thereof will be omitted.

The controller 1100 may be connected to a host and the memory device 1200 and may be suitable for accessing the memory device 1200 in response to a request from the host. For example, the controller 1100 may be suitable for controlling read, write, erase and background operations of the memory device 1200.

The RAM 1110 may be used as an operation memory, a cache memory between the memory device 1200 and the host, and a buffer memory between the memory device 1200 and the host. The RAM 1110 may be replaced by an SRAM (Static Random Access Memory), a ROM (Read Only Memory) or the like.

The CPU 1120 may be suitable for controlling overall operation of the controller 1100. For example, the CPU 1120 may be suitable for operating firmware such as an FTL (Flash Translation Layer) stored in the RAM 1110.

The host interface 1130 may be suitable for performing interfacing with the host. For example, the controller 1100 may communicate with the host through at least one of various protocols such as USB (Universal Serial Bus) protocol, MMC (MultiMedia Card) protocol, PCI (Peripheral Component Interconnection) protocol, PCI-E (PCI-Express) protocol, ATA (Advanced Technology Attachment) protocol, Serial-ATA protocol, Parallel-ATA protocol, SCSI (Small Computer Small Interface) protocol, ESDI (Enhanced Small Disk Interface) protocol, IDE (Integrated Drive Electronics) protocol and private protocol.

The ECC circuit 1140 may be suitable for detecting and correcting errors in data read from the memory device 1200 using the ECC.

The memory interface 1150 may be suitable for performing interfacing with the memory device 1200. For example, the memory interface 1150 may include a NAND interface or a NOR interface.

The controller 1100 may further include a buffer memory (not illustrated) in order to store data temporarily. Here, the buffer memory may be used to temporarily store data delivered to outside through the host interface 1130, or to temporarily store data delivered from the memory device 1200 through the memory interface 1150. In addition, the controller 1100 may further include a ROM to store code data for interfacing with the host.

As described above, since the memory system 1000 according to an embodiment includes the memory device 1200 having improved characteristics, characteristics of the memory system 1000 may be improved.

Figure 19:
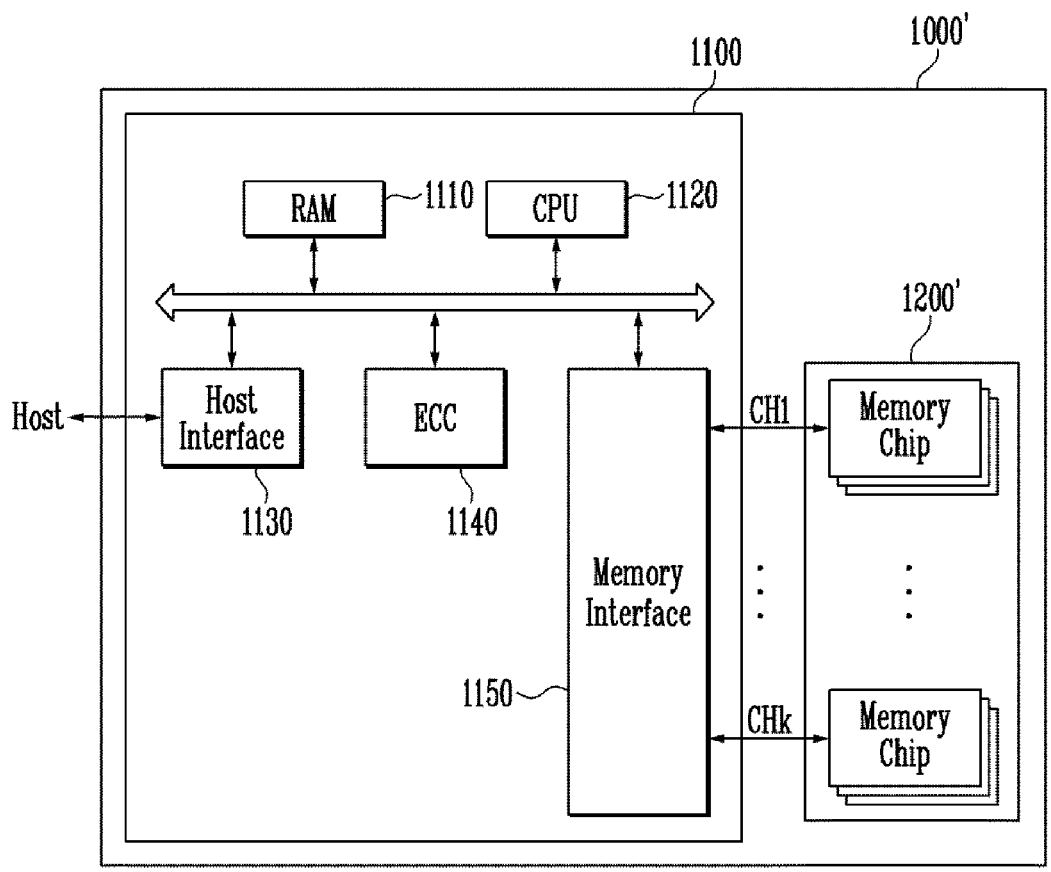

FIG. 19 is a block diagram illustrating a representation of the configuration of a memory system according to an embodiment. Hereinafter, a description of common contents with earlier described embodiments is omitted.

As illustrated in FIG. 19, the memory system 1000' according to an embodiment may include a memory device 1200' and the controller 1100. In addition, the controller 1100 may include a RAM 1110, a CPU 1120, a host interface 1130, an ECC circuit 1140 and a memory interface 1150.

The memory device 1200' may be a non-volatile memory and may be, for example, the semiconductor device described above with reference to FIGS. 1A to 17. In addition, the memory device 1200' may include a first source layer, a first insulating layer over the first source layer, a first stacked structure over the first insulating layer, and first channel layers passing through the first stacked structure and the first insulating layer. The memory device 1200' may include a second source layer including a first region interposed between the first source layer and the first insulating layer and a second region interposed between the first channel layers and the first insulating layer. Since the memory device 1200' is configured and manufactured as described above, a detailed description thereof will be omitted.

In addition, the memory device 1200' may be a multi-chip package including a plurality of the memory chips. The plurality of memory chips may be divided into a plurality of groups, and the plurality of groups may be suitable for communicating with the controller 1100 through first to k-th channel CH1 to CHk. The memory chips belonging to one group may be suitable for communicating with the controller 1100 through a common channel. The memory system 1000' may be modified so that a single memory chip may be coupled to a single channel.

As described above, since the memory system 1000' according to an embodiment includes the memory device 1000' which is easy to manufacture and has improved characteristics, characteristics of the memory system 1000' may also be improved. By forming the memory device 1200' as a multi-chip package, data storage capacity and driving speed of the memory system 1000' may be increased.

Figure 20:
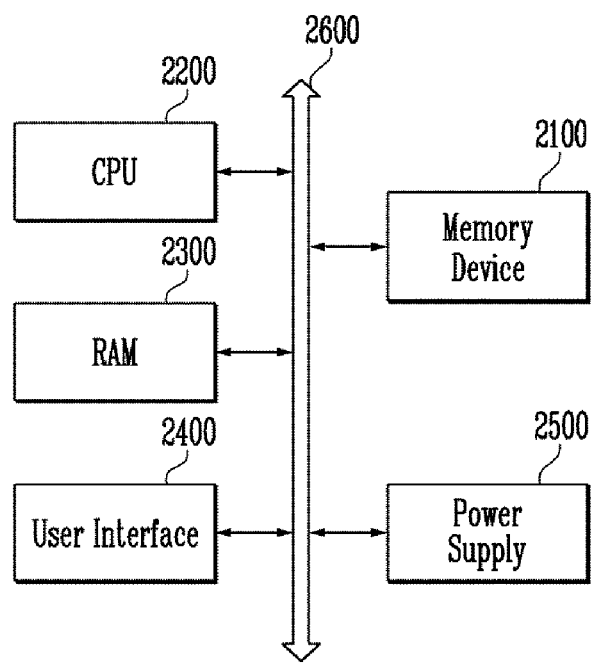
FIGS. 20 and 21 are block diagrams illustrating a representation of the configuration of a computing system according to an embodiment.

FIG. 20 is a block diagram illustrating a representation of the configuration of a computing system according to an embodiment. Hereinafter, a description of the contents of the computing system according to an embodiment the same as those of the semiconductor device of the earlier embodiment will be omitted.

Referring to FIG. 20, a computer system 2000 according to an embodiment may include a memory device 2100, a CPU 2200, a RAM 2300, a user interface 2400, a power supply 2500 and a system bus 2600.

The memory device 2100 may store data provided through the user interface 2400 and data processed by the CPU 2200. The memory device 2100 may be electrically connected to the CPU 2200, the RAM 2300, the user interface 2400 and the power supply 2500 through the system bus 2600. For example, the memory device 2100 may be connected to the system bus 2600 through a controller (not illustrated) or directly connected to the system bus 2600. When the memory device 2100 is directly connected to the system bus 2600, functions of the controller may be performed by the CPU 2200 and the RAM 2300.

The memory device 2100 may be a non-volatile memory and may be, for example, the semiconductor device described above with reference to FIGS. 1A to 17. The memory device 2100 may include a first source layer, a first insulating layer over the first source layer, a first stacked structure over the first insulating layer, and first channel layers passing through the first stacked structure and the first insulating layer. The memory device 2100 may include a second source layer including a first region interposed between the first source layer and the first insulating layer and a second region interposed between the first channel layers and the first insulating layer. Since the memory device 2100 is configured and manufactured as described above, a detailed description thereof will be omitted.

In addition, the memory device 2100 may be a multi-chip package configured by a plurality of memory chips as described with reference to FIG. 18.

The computer system 2000 having such a configuration may be a computer, a UMPC (Ultra Mobile PC), a workstation, a net-book, a PDA (Personal Digital Assistant), a portable computer, a web tablet, a wireless phone, a mobile phone, a smart phone, an e-book, a PMP (Portable Multimedia Player), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network and an RFID device.

As described above, the computing system 2000 according to an embodiment includes the memory device 2100 which is easy to manufacture and has improved characteristics, characteristics of the computing system 2000 may be improved.

Figure 21:
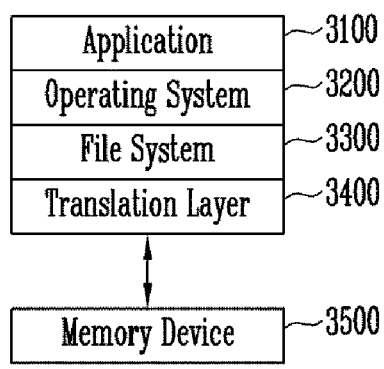

FIG. 21 is a block diagram illustrating a representation of a computing system according to an embodiment.

Referring to FIG. 21, a computing system 3000 according to an embodiment may include a software layer having an operating system 3200, an application 3100, a file system 3300, a translation layer 3400, and a hardware layer such as a memory device 3500.

The operating system 3200 may manage software resources and hardware resources of the computer system 3000 and control program execution by the CPU. The application 3100 may be various application programs executed in the computer system 3000 and may be a utility performed by the operating system 3200.

The file system 3300 may refer to a logical structure to manage data and files which exist in the computer system 3000. The file system 3300 may organize files or data to be stored in the memory device 3500 according to rules. The file system 3300 may be determined by the operating system 3200 used in the computer system 3000. For example, when the operating system 3200 is Microsoft Windows, the file system 3300 may be File Allocation Table (FAT) or NT File System (NTFS). In addition, when the operating system 3200 is Unix/Linux, the file system 3300 may be Extended File System (EXT), Unix File System (UFS) or Journaling File System (JFS).

In FIG. 21, the operating system 3200, the application 3100 and a file system 3300 are illustrated as separate blocks. However, the application 3100 and the file system 3300 may be included in the operating system 3200.

The translation layer 3400 may translate an address into an appropriate type for the memory device 3500 in response to a request from the file system 3300. For example, the translation layer 3400 may translate a logical address created by the file system 3300 into a physical address of the memory device 3500. Mapping information of the logical address and the physical address may be stored in an address translation table. For example, the translation layer 3400 may be a Flash Translation Layer (FTL) or a Universal Flash Storage Link Layer (ULL).

The memory device 3500 may be a non-volatile memory and may be, for example, the semiconductor device described above with reference to FIGS. 1A to 17. In addition, the memory device 3500 may include a first source layer, a first insulating layer over the first source layer, a first stacked layer over the first insulating layer, and first channel layers passing through the first stacked layer and the first insulating layer. The memory device 3500 may include a second source layer including a first region interposed between the first source layer and the first insulating layer and a second region interposed between the first channel layers and the first insulating layer. Since the memory device 3500 is configured and manufactured as described above, a detailed description thereof will be omitted.

The computer system 3000 having this configuration may be separated into an operating system layer performed in the upper level region and a controller layer performed in the lower level region. The application 3100, the operating system 3200 and the file system 3300 may be included in the operating system layer and may be driven by an operating memory of the computer system 3000. In addition, the translation layer 3400 may be included in the operating system layer or in the controller layer.

As described above, since the computing system 3000 according to an embodiment includes the memory device 3500 which may make it easier to manufacture and may have improved characteristics, characteristics of the computing system 3000 may also be improved.

According to the various embodiments, it may be easier to manufacture a semiconductor device, and characteristics of the semiconductor device may be improved.

What is claimed is:

1. A method of manufacturing a semiconductor device, the method comprising:
   forming a first sacrificial layer over a first source layer;
   forming a first stacked structure over the first sacrificial layer;
   forming first holes passing through the first stacked structure and the first sacrificial layer;
   forming a first channel layer in each of the first holes and a first memory layer surrounding the first channel layer;
   forming a first slit passing through the first stacked structure and the first sacrificial layer;
   forming a first opening by removing the first sacrificial layer through the first slit;
   partially removing the first memory layer exposed through the first opening to expose the first channel layer; and
   forming a second source layer on the first channel layer exposed through the first opening.

2. The method of claim 1, further comprising forming an isolation insulating layer passing through at least the first sacrificial layer and located at a boundary between a cell region and a contact region and at a boundary between neighboring memory blocks.

3. The method of claim 1, further comprising forming a second sacrificial layer over the first source layer before the forming of the first sacrificial layer, wherein the second sacrificial layer is removed during the partially removing of the first memory layer.

4. The method of claim 1, further comprising forming an insulating layer in the first slit and the first opening after the second source layer is formed.

5. The method of claim 1, wherein the forming of the first stacked structure comprises:
   forming a lower portion of the first stacked structure over the first sacrificial layer;
   forming a first slit insulating layer passing through the lower portion of the first stacked structure and extending in substantially one direction; and
   forming an upper portion of the first stacked structure over the lower portion of the first stacked structure.

6. The method of claim 5, further comprising forming a second slit insulating layer in the first slit, passing through the first stacked structure, and coupled to the first slit insulating layer to extend in substantially the one direction.

7. The method of claim 1, wherein the forming of the second source layer comprises growing the second source layer by using the first channel layer, exposed through the first opening, as a seed.

8. The method of claim 1, wherein the forming of the second source layer comprises:
   doping the first channel layer and the first source layer exposed through the first opening with impurities; and
   forming the second source layer by siliciding the first channel layer and the first source layer doped with the impurities.

9. The method of claim 1, further comprising:
   forming a third sacrificial layer on the first stacked structure, after forming the first memory layer;
   forming a second stacked structure over the third sacrificial layer;
   forming second holes passing through the second stacked structure and the third sacrificial layer and exposing the first channel layers; and
   forming second channel layers in the second holes and second memory layers surrounding the second channel layers.

10. The method of claim 9, further comprising:
    forming a second slit through the second stacked structure and the third sacrificial layer;
    forming a second opening by removing the third sacrificial layer through the second slit;
    partially removing the second memory layer exposed through the second opening to expose the second channel layer; and
    forming a coupling pattern over the second channel layer exposed through the second opening.

11. The method of claim 10, wherein the forming of the coupling pattern comprises growing the coupling pattern by using the second channel layer, exposed through the second opening, as a seed.

12. The method of claim 10, wherein the coupling pattern is formed including selective growth to reduce the contact resistance between the second channel layer and the first channel layer.

13. The method of claim 10, wherein the coupling pattern formed over the second channel layer, exposed through the second opening, is formed at substantially the same time as the formation of the second source layer on the first channel layer exposed through the first opening.

* * * * *